(12) United States Patent
Hopkins et al.

(10) Patent No.: US 9,530,683 B2
(45) Date of Patent: Dec. 27, 2016

(54) FORMING SOURCE/DRAIN ZONES WITH A DIELECTRIC PLUG OVER AN ISOLATION REGION BETWEEN ACTIVE REGIONS

(71) Applicant: MICRON TECHNOLOGY, INC., Boise, ID (US)

(72) Inventors: John Hopkins, Boise, ID (US); James Matthew, Boise, ID (US); Jie Sun, Boise, ID (US); Gordon Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 14/534,454

(22) Filed: Nov. 6, 2014

(65) Prior Publication Data

US 2015/0064871 A1    Mar. 5, 2015

Related U.S. Application Data

(62) Division of application No. 13/343,087, filed on Jan. 4, 2012, now Pat. No. 8,907,396.

(51) Int. Cl.
*H01L 21/336* (2006.01)
*H01L 21/762* (2006.01)
*H01L 27/115* (2006.01)

(52) U.S. Cl.
CPC ..... *H01L 21/76224* (2013.01); *H01L 27/1157* (2013.01); *H01L 27/11524* (2013.01)

(58) Field of Classification Search
USPC .......... 438/287, 259; 257/E21.423, E29.309, 257/296, 314, 315, 316, 317, 324, 330, 331; 365/185.26, 185.28
See application file for complete search history.

(56) References Cited

U.S. PATENT DOCUMENTS

| | | | |
|---|---|---|---|
| 6,541,810 B2 | 4/2003 | Divakaruni et al. | |
| 6,566,177 B1 | 5/2003 | Radens et al. | |
| 6,613,652 B2 | 9/2003 | Lim et al. | |
| 7,229,894 B2 | 6/2007 | Koh | |
| 7,400,024 B2 | 7/2008 | Kunnen | |
| 7,838,920 B2 | 11/2010 | Ghodsi | |
| 2003/0234422 A1 | 12/2003 | Wang et al. | |
| 2004/0094821 A1 | 5/2004 | Lur et al. | |
| 2005/0285179 A1 | 12/2005 | Violette | |
| 2008/0130372 A1 | 6/2008 | Ghodsi | |
| 2011/0186918 A1 | 8/2011 | Sung | |
| 2012/0231592 A1 | 9/2012 | Haller et al. | |

*Primary Examiner* — Telly Green
(74) *Attorney, Agent, or Firm* — Dicke, Billig & Czaja, PLLC

(57) ABSTRACT

An embodiment includes forming an isolation region between first and second active regions in a semiconductor, forming an opening between the first and second active regions by removing a portion of the isolation region, and forming a dielectric plug within the opening so that the dielectric plug is between the first and second active regions and so that a portion of the dielectric plug extends below upper surfaces of the first and second active regions. The dielectric plug may be formed of a dielectric material having a lower removal rate than a dielectric material of the isolation region for a particular isotropic removal chemistry.

21 Claims, 21 Drawing Sheets

US 9,530,683 B2

FORMING SOURCE/DRAIN ZONES WITH A DIELECTRIC PLUG OVER AN ISOLATION REGION BETWEEN ACTIVE REGIONS

RELATED APPLICATION

This application is a divisional of U.S. patent application Ser. No. 13/343,087, titled, "SOURCE/DRAIN ZONES WITH A DIELECTRIC PLUG OVER AN ISOLATION REGION BETWEEN ACTIVE REGIONS AND METHODS," filed Jan. 4, 2012 and issued as U.S. Pat. No. 8,907,396 on Dec. 9, 2014, which is commonly assigned and incorporated in its entirety herein by reference.

FIELD

The present disclosure relates generally to source/drain zones and in particular the present disclosure relates to source/drain zones with a dielectric plug over an isolation region between active regions and methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory may include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, a column of memory cells are coupled in parallel with each memory cell coupled to a data line, such as a bit line. A "column" refers to a group of memory cells that are commonly coupled to a local data line, such as a local bit line. It does not require any particular orientation or linear relationship, but instead refers to the logical relationship between memory cell and data line.

Typically, the array of memory cells for NAND flash memory devices is arranged such that the control gate of each memory cell of a row of the array is connected together to form an access line, such as a word line. Columns of the array include strings (often termed NAND strings) of memory cells connected together in series, e.g., source to drain, between a pair of select lines, e.g., a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line. For example, each drain select gate may be coupled to a data line by a contact.

In order for memory manufacturers to remain competitive, memory designers are constantly trying to increase the density of memory devices. Increasing the density of a flash memory device generally requires reducing the spacing between memory cells in adjacent columns and between adjacent data lines respectively coupled to those columns. However, reduced spacing may increase the likelihood that the contacts that couple data lines to drain select gates may be misaligned. Misaligned contacts may cause shorts to occur between adjacent data lines and thus shorts to occur between adjacent columns of memory cells.

For the reasons stated above, and for other reasons stated below which will become apparent to those skilled in the art upon reading and understanding the present specification, there is a need in the art for alternatives to existing methods for forming contacts that couple data lines to drain select gates.

DETAILED DESCRIPTION

Figure 1:
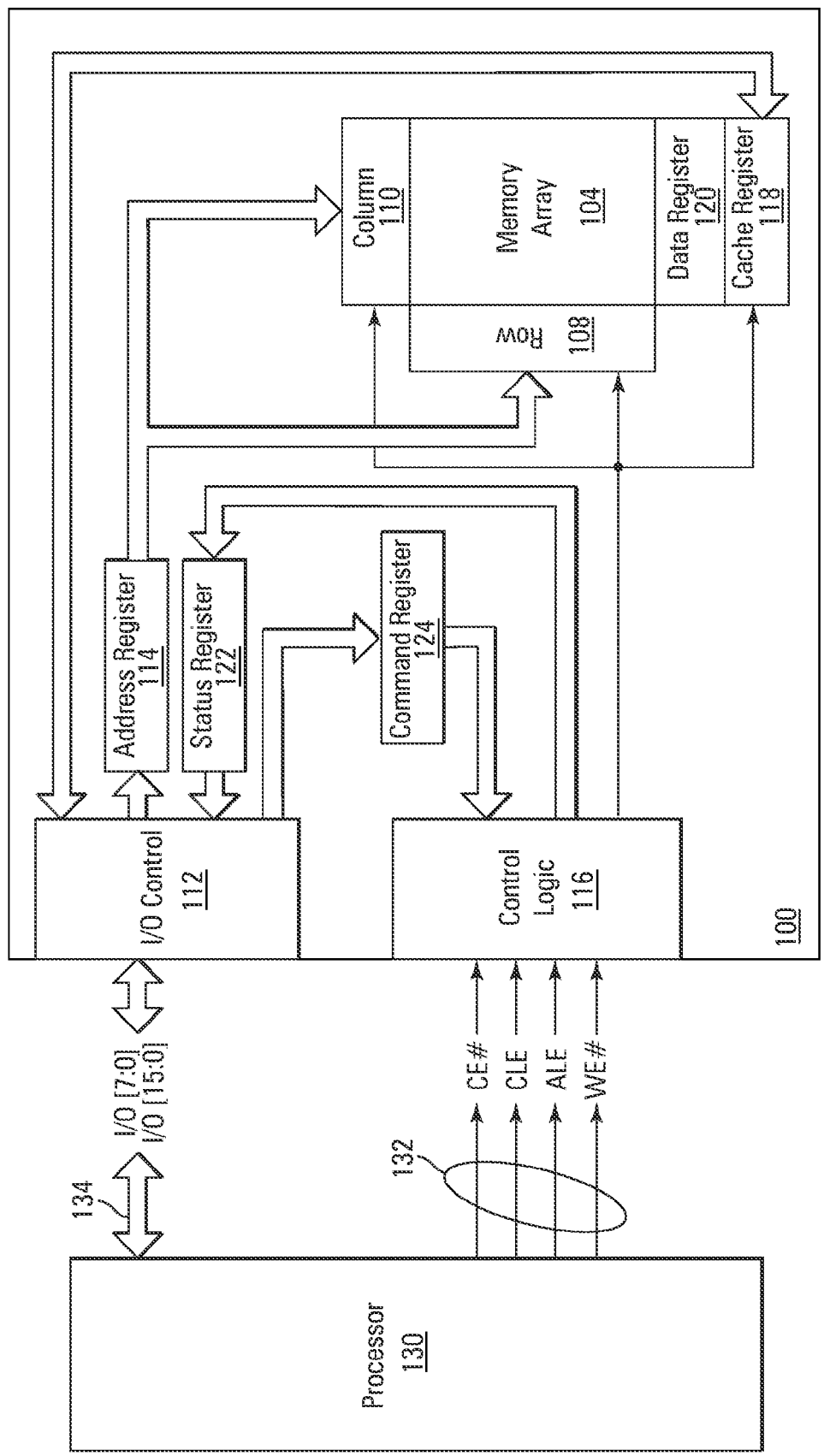
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a simplified block diagram of a NAND flash memory device 100 in communication with a processor 130 as part of an electronic system, according to an embodiment. The processor 130 may be a memory controller or other external host device.

Memory device 100 includes an array of memory cells 104 formed in accordance with embodiments of the disclosure. That is, memory array 104 may include source/drain zone having active regions that may be coupled to contacts that may be coupled to data lines, such as bit lines. A source/drain zone is a portion of the memory array 104 in which source/drain regions of select gates may be formed for one or more strings of memory cells. The source/drain zone may include an isolation region and a dielectric plug, e.g., a nitride plug, between adjacent active regions. The dielectric plug may extend below upper surfaces of the adjacent active regions. The dielectric plug may have a lower removal rate (e.g., etch rate) than the isolation regions for a particular isotropic removal (e.g., etch) chemistry, e.g., isopropyl alcohol and ammonium bifluoride ($NH_4HF_2$), ammonium fluoride ($NH_4F$) and phosphoric acid ($H_3PO_4$), etc. The dielectric plug may act to reduce the likelihood of shorts that may occur between a misaligned contact and an adjacent active region.

A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data are passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
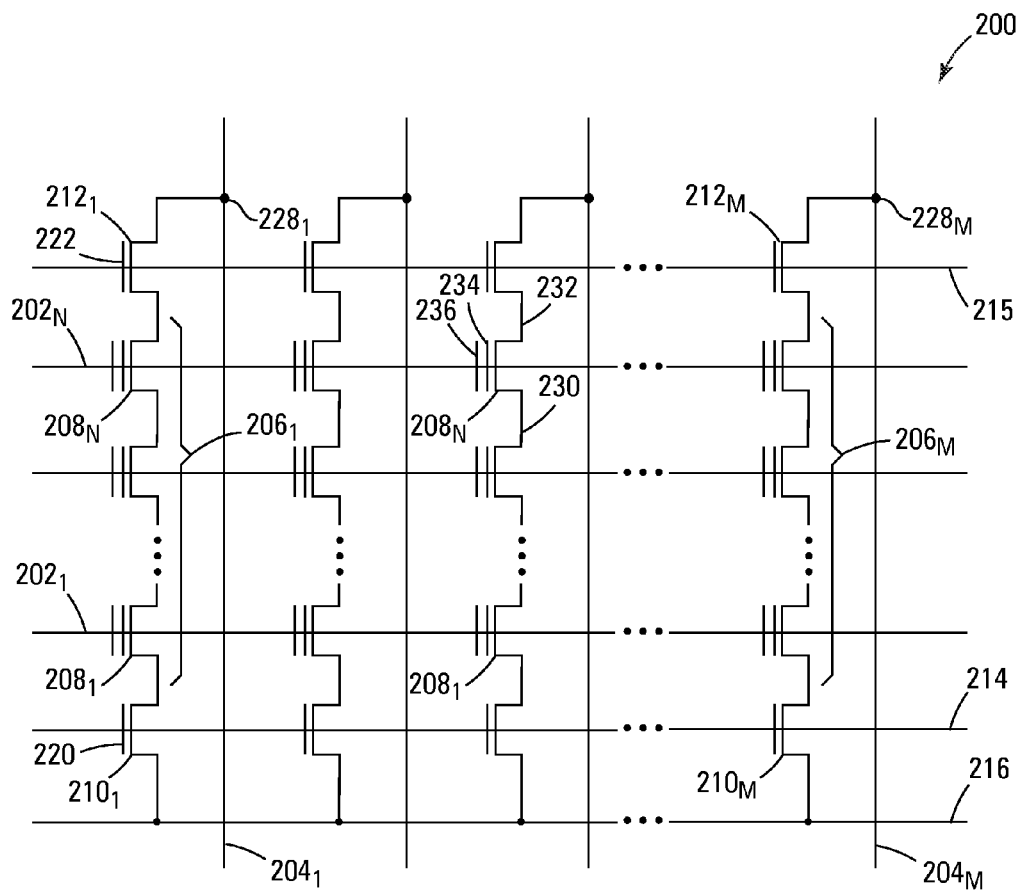
FIG. 2 is a schematic of a NAND memory array, according to another embodiment.

FIG. 2 is a schematic of a NAND memory array 200, e.g., as a portion of memory array 104, in accordance with another embodiment. Memory array 200 includes access lines, such as word lines $202_1$ to $202_N$, and intersecting data lines, such as bit lines $204_1$ to $204_m$. For ease of addressing in the digital environment, the number of word lines 202 and the number of bit lines 204 are each some power of two, e.g., 256 word lines 202 by 4,096 bit lines 204. The bit lines 204 may be coupled to global data lines, such as global bit lines (not shown), in a many-to-one relationship.

Memory array 200 is arranged in rows (each corresponding to a word line 202) and columns (each corresponding to a bit line 204). Each column may include a string, such as one of NAND strings $206_1$ to $206_m$. Each NAND string 206 is coupled to a common source line 216 and includes memory cells $208_1$ to $208_N$, each located at an intersection of a word line 202 and a bit line 204. The memory cells 208 represent non-volatile memory cells for storage of data. The memory cells 208 of each NAND string 206 are connected in series, e.g., source to drain, between a source select line 214 and a drain select line 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212.

A source of each source select gate 210 is connected to common source line 216. The drain of each source select gate 210 may be connected to the source of the memory cell 208 of the corresponding NAND string 206. For example, the drain of source select gate $210_1$ may be connected to the source of memory cell $208_1$ of the corresponding NAND string $206_1$. Therefore, each source select gate 210 selectively couples a corresponding NAND string 206 to common source line 216. A control gate 220 of each source select gate 210 is connected to source select line 214.

The drain of each drain select gate 212 is connected to the bit line 204 for the corresponding NAND string at a contact 228 (e.g., that may be called a drain contact), such as a data-line contact, e.g., a bit-line contact. For example, the drain of drain select gate $212_1$ may be connected to the bit line $204_1$ for the corresponding NAND string $206_1$ at contact $228_1$. The source of each drain select gate 212 may be connected to the drain of the last memory cell $208_N$ of the corresponding NAND string 206. For example, the source of drain select gate $212_1$ may be connected to the drain of memory cell $208_N$ of the corresponding NAND string $206_1$. Therefore, each drain select gate 212 selectively couples a corresponding NAND string 206 to a corresponding bit line 204. A control gate 222 of each drain select gate 212 is connected to drain select line 215.

Typical construction of memory cells 208 includes a source 230 and a drain 232, a charge-storage structure 234 (e.g., a floating gate, charge trap, etc.) that can store a charge that determines a data value of the cell, and a control gate 236, as shown in FIG. 2. Memory cells 208 have their control gates 236 coupled to (and in some cases from) a word line 202. A column of the memory cells 208 is a NAND string 206 coupled to a given bit line 204. A row of the memory cells 208 are those memory cells commonly coupled to a given word line 202.

Although the examples of FIGS. 1 and 2 were discussed in conjunction with NAND flash, the embodiments described herein are not limited to NAND flash, but can include other flash architectures, such as NOR flash, etc.

Figure 3:
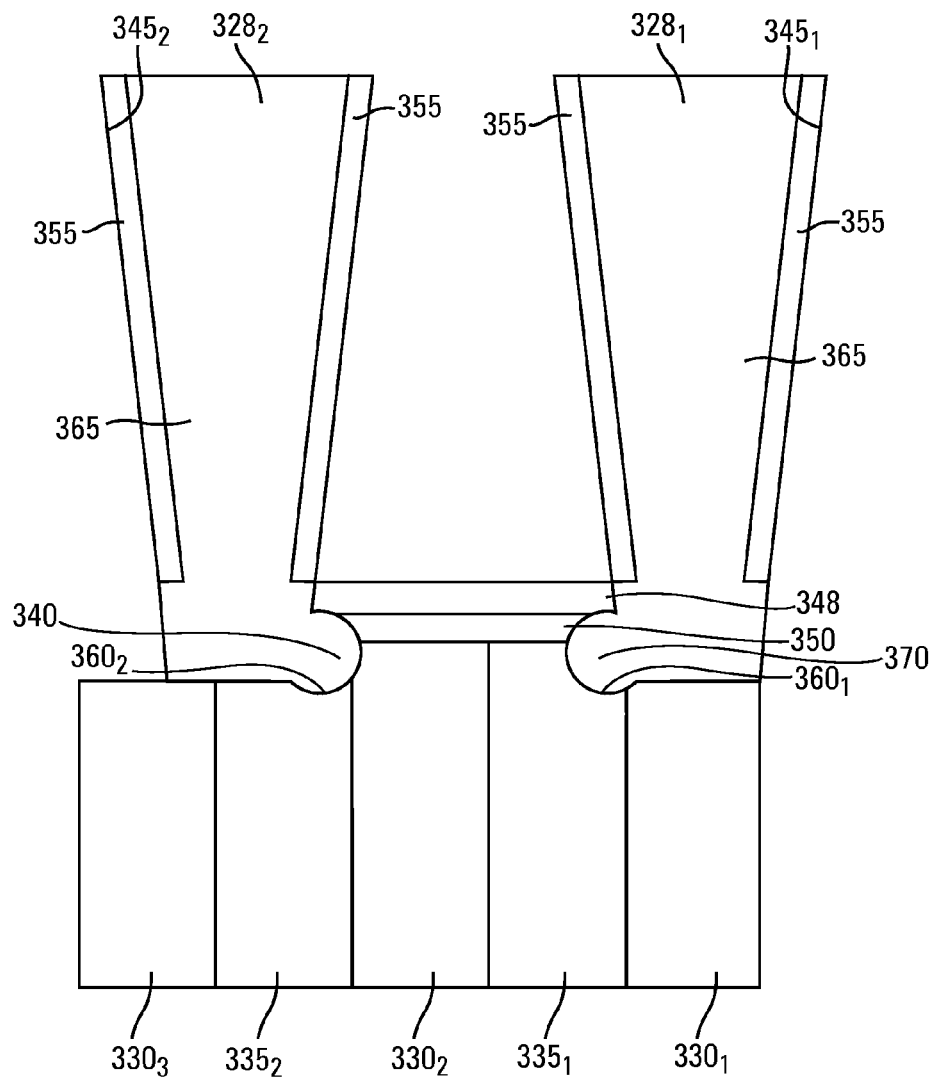
FIG. 3 is a cross-section illustrating a misaligned contact, according to the prior art.

FIG. 3 is a cross-section illustrating an aligned contact $328_1$ and a misaligned contact $328_2$, according to the prior art. For example, contacts 328 may be referred to as data-line contacts, e.g., bit-line contacts, or drain contacts. Contact $328_1$ is substantially vertically aligned (e.g., vertically aligned) with an active region $330_1$. An isolation region $335_1$ may isolate active region $330_1$ from an active region $330_2$. Isolation region $335_1$ may electrically isolate, at least in part, contact $328_1$ from active region $330_2$.

An isolation region $335_2$ may isolate an active region $330_3$ from active region $330_2$. Contact $328_2$ was intended to be substantially vertically aligned (e.g., vertically aligned) with active region $330_2$, but, e.g., owing to processing errors, overlaps isolation region $335_2$. This misalignment may give rise to an electrical short between active region $330_3$ and active region $330_2$ due to the portion 340 of contact $328_2$ coming in contact with active region $330_2$. Note that the portions of active regions 330 shown in FIG. 3 may be source/drains (e.g., drains) of drain select gates respectively formed over active regions 330.

Contacts $328_1$ and $328_2$ may respectively couple data lines through active regions $330_1$ and $330_3$ to the drain select gates that are respectively formed over active regions $330_1$ and $330_3$. The drain select gates that are respectively formed over active regions $330_1$ and $330_3$ may selectively couple the data lines respectively coupled to contacts $328_1$ and $328_2$ to strings of memory cells respectively formed over active regions $330_1$ and $330_3$.

A drain select gate may be formed over active region $330_2$ and may be coupled to a string of memory cells formed over active region $330_2$. A contact (e.g., located in a plane parallel to the face plane of FIG. 3 and thus not shown) may couple a data line through active region $330_2$ to the drain select gate formed over active region $330_2$ so that the drain select gate formed over active region $330_2$ selectively couples the data line to the string of memory cells formed over active region $330_2$. Therefore, due to its misalignment, contact $328_2$ may electrically short the data line coupled thereto, and thus the string of memory cells formed over active region $330_3$, to the string of memory cells formed over active region $330_2$ and to the data line selectively coupled to the string of memory cells formed over active region $330_2$ by the drain select gate formed over active region $330_2$.

Contacts $328_1$ and $328_2$ may be respectively formed in openings $345_1$ and $345_2$ that may terminate at a dielectric 348 over a dielectric 350, as shown in FIG. 3. For example, openings 345 may be formed in a dielectric formed over dielectric 348. Dielectric 348 may be a nitride and dielectric 350 may be an oxide. It is intended that openings $345_1$ and $345_2$ be respectively substantially vertically aligned (e.g., vertically aligned) with an active regions $330_1$ and $330_3$ but, e.g., owing to processing errors, opening $345_2$ overlaps isolation region $335_2$ so that opening $345_2$ is misaligned with active region $330_3$.

A protective liner 355 may be formed in openings $345_1$ and $345_2$. Portions of dielectric 348 and dielectric 350 under openings $345_1$ and $345_2$ may then be removed through openings $345_1$ and $345_2$, stopping at active regions $330_1$ and $330_3$ so that opening $345_1$ exposes active region $330_1$ and opening $345_2$ exposes a portion of active region $330_3$ and a portion of isolation region $335_2$, owing to the misalignment of opening $345_2$. Protective liner 355 may extend to dielectric 348, as shown in FIG. 3.

Subsequently, a clean operation (e.g., a clean-up etch) may be performed, e.g., using a wet etch, such as an isotropic wet etch, to remove native oxide that may form on the exposed surfaces of active regions $330_1$ and $330_3$ for improving electrical contact between contacts $328_1$ and $328_2$ and active regions $330_1$ and $330_3$. For example, etchant, e.g., having the particular isotropic removal chemistry, may be introduced through openings 345.

The etch may remove a portion of isolation region $335_1$ and a portion of dielectric 350 to form a region $360_1$ that may extend from opening $345_1$ into isolation region $335_1$, in that isolation region $335_1$ and dielectric 350 may etch at about the same rate as the native oxide when exposed to the etchant that removes the native oxide. In other words, the etch that removes the native oxide may be selective to isolation region $335_1$ and dielectric 350, as well as the native oxide.

However, due to the fact that misaligned opening $345_2$ overlaps isolation region $335_2$, the etch may remove a portion of isolation region $335_2$, a portion of dielectric 348, and a portion of active region $330_2$ to form a region $360_2$ that extends from opening $345_2$ into active region $330_2$. Openings $345_1$ and $345_2$ may be filled with a conductor 365 that also fills regions $360_1$ and $360_2$ to form contacts $328_1$ and $328_2$, where contact $328_1$ includes a portion 370 formed by the conductor 365 in region $360_1$ and contact $328_2$ includes the portion 340 formed by the conductor 365 in region $360_2$.

Figure 4:
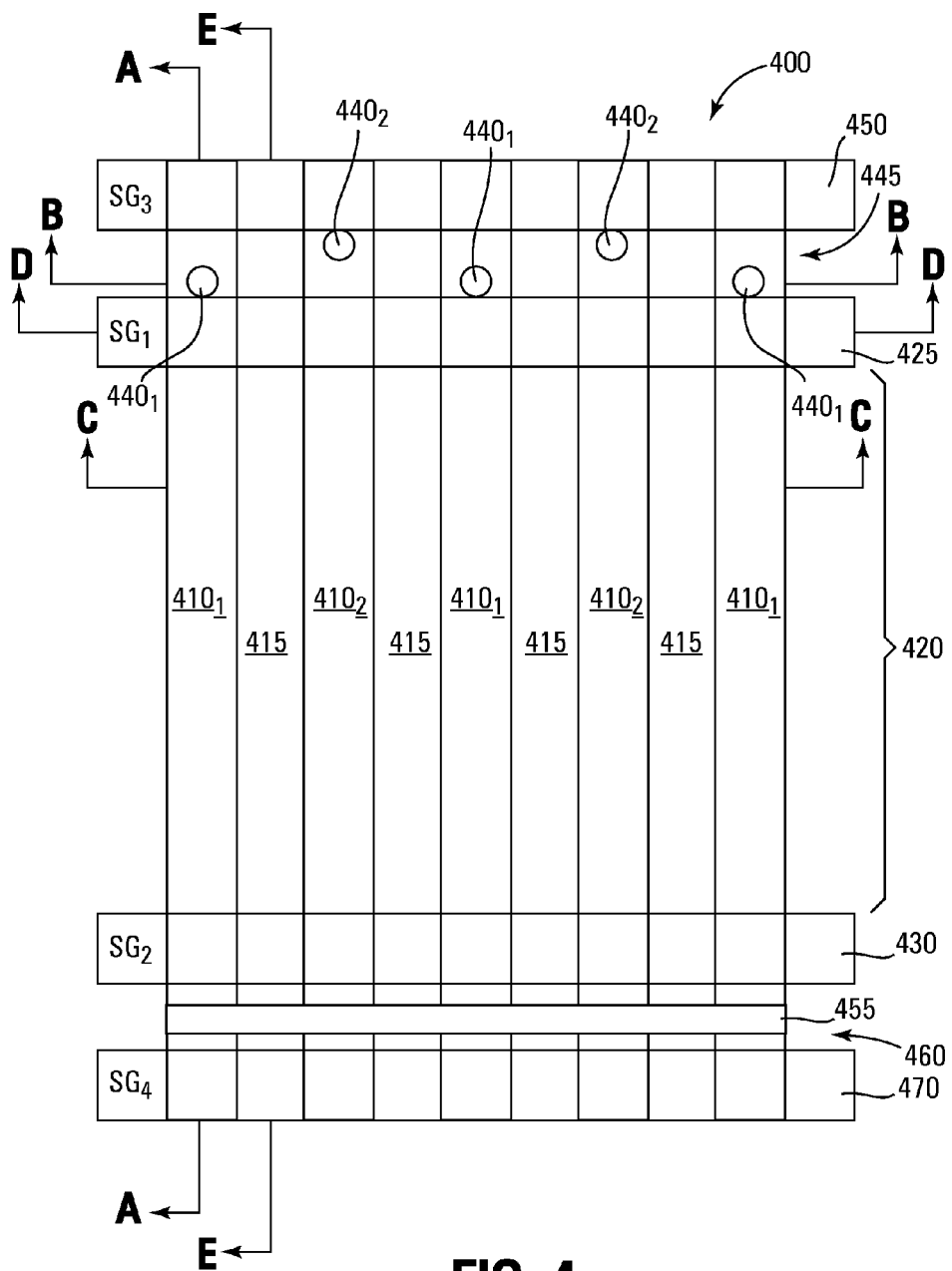
FIG. 4 is a top plan view of a memory array, according to an embodiment.

FIG. 4 is a top plan view of a memory array 400, such as a portion of memory array 104 in FIG. 1 and memory array 200 in FIG. 2. FIG. 4 is intended to show where the various cross-sections discussed below are taken and how the various cross-sections relate to the overall layout of memory array 400. Memory array may 400 include a plurality of active regions 410, extending along a column direction. An isolation region 415, such as a shallow trench isolation (STI) region, extending in the column direction, may be between active regions 410. For example, active regions 410 may alternate and an isolation region may be between and successively adjacent to active regions 410.

One or more columns of (e.g., one or more strings of memory cells coupled in series) may be formed over each active region 410. For example, a string of memory cells may be over each active region 410 within a memory-cell region, such as a string region 420, of memory array 400. String region 420 may be between a select-gate, such as a drain-select-gate, region 425 of memory array 400, denoted by the indicia $SG_1$, and a select-gate, such as a source-select-gate, region 430 of memory array 400, denoted by the indicia $SG_2$.

A select gate, such as a drain select gate, may be formed over each active region 410 within drain-select-gate region 425, and a select gate, such as a source select gate, may be formed over each active region 410 within source-select-gate region 430. The drain select gate over a respective active region 410 may be coupled to (e.g., in series with) one end of a string of memory cells formed over the respective active region 410 in string region 420, and the source select gate over the respective active region 410 may be coupled to (e.g., in series with) an opposite end of the string of memory cells formed over the respective active region 410 in string region 420.

For some embodiments, the strings of memory cells in string region 420 that are formed over every other active region 410, e.g., formed over active regions $410_1$, may be selectively coupled to contacts $440_1$ through the drain select gates within drain-select-gate region 425 formed over active regions $410_1$. In other words, the strings of memory cells that are formed over alternate active regions 410 may be selectively coupled to contacts $440_1$. For example, contacts $440_1$ may be coupled to active regions $410_1$.

An active region $410_2$ and an isolation region 415 on either side of that active region $410_2$ may be between a pair of active regions $410_1$. As such, active regions $410_2$ are alternating active regions. For some embodiments, the strings of memory cells in string region 420 that are formed over active regions $410_2$ may be coupled to contacts $440_2$ through the drain select gates within drain-select-gate region 425 formed over active regions $410_2$. For example, contacts $440_2$ may be coupled to active regions $410_2$. Contacts 440 may be staggered. For example, contacts $440_1$ may be offset from contacts $440_2$. Contacts 440 may be referred to as data-line contacts, e.g., bit-line contacts, or drain contacts.

Source/drains, e.g., drains, may be formed in respective ones of active regions $410_1$ and $410_2$ within a source/drain zone 445. For example, drain regions of select gates may be formed for one or more strings of memory cells in source/drain zone 445. Contacts $440_1$ and $440_2$ may be coupled to respective ones of the drains in active regions $410_1$ and $410_2$ of source/drain zone 445. Drain-select-gate region 425 may be between source/drain zone 445 and string region 420, so that the drain select gates may be between contacts 440 and the strings of memory cells.

For some embodiments, drain select gates within another select gate region, such as a drain-select-gate region 450 denoted by the indicia $SG_3$, may be respectively formed over active regions 410 and may be coupled to contacts $440_1$ and $440_2$. The drain select gates in drain-select-gate region 450 over active regions $410_1$ and $410_2$ may respectively selectively couple strings of memory cells in a string region (not shown) on the other side of source/drain zone 445 from string region 420 to contacts $440_1$ and $440_2$.

The strings of memory cells of string region 420 over active regions $410_1$ and $410_2$ may be coupled to a source line 455 within a source/drain zone 460 through the source select gates within source-select-gate region 430 formed over active regions 410. For example, a source region may be formed in source/drain zone 460. For some embodiments, source line 455 may be coupled to source/drains, e.g., sources, of the source select gates within source/drain zone 460, where the sources are formed in the active regions 410 in source/drain zone 460.

For some embodiments, source/drain zone 460 may be between source-select-gate region 430 and another select gate region, such as a source-select-gate region 470, denoted by the indicia $SG_4$. Select gates, such as source select gates, of source-select-gate region 470 formed over the active regions 410 may be coupled to strings of memory cells formed over extensions of active regions 410 (not shown) on the other side of source-select-gate region 470 in another string area (not shown) on the other side of source-select-gate region 470.

Figure 8:
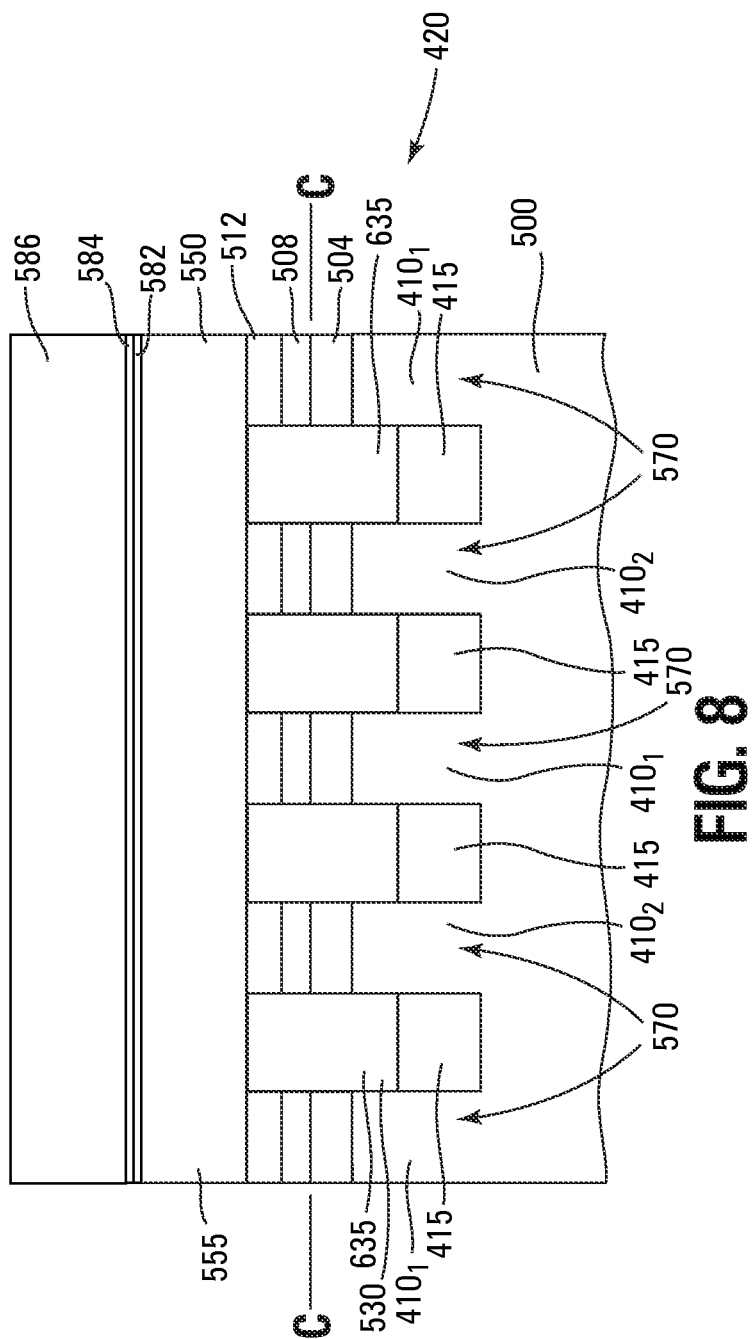
FIG. 8 shows a cross-section viewed along line C-C during a stage of fabrication, according to another embodiment.
Figure 9A:
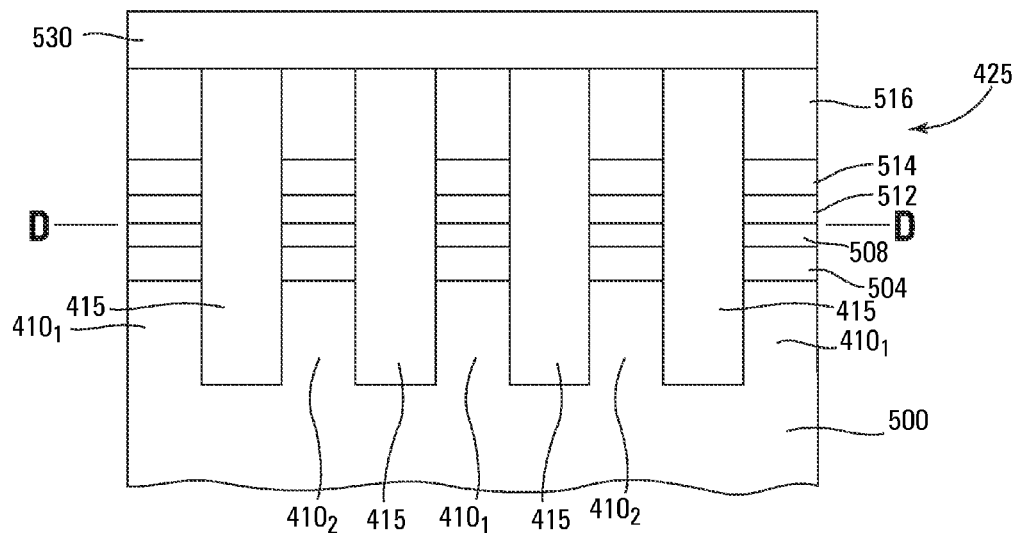
FIGS. 9A-9C show a cross-section viewed along line D-D in FIG. 4 during various stages of fabrication, according to another embodiment.
Figure 9B:
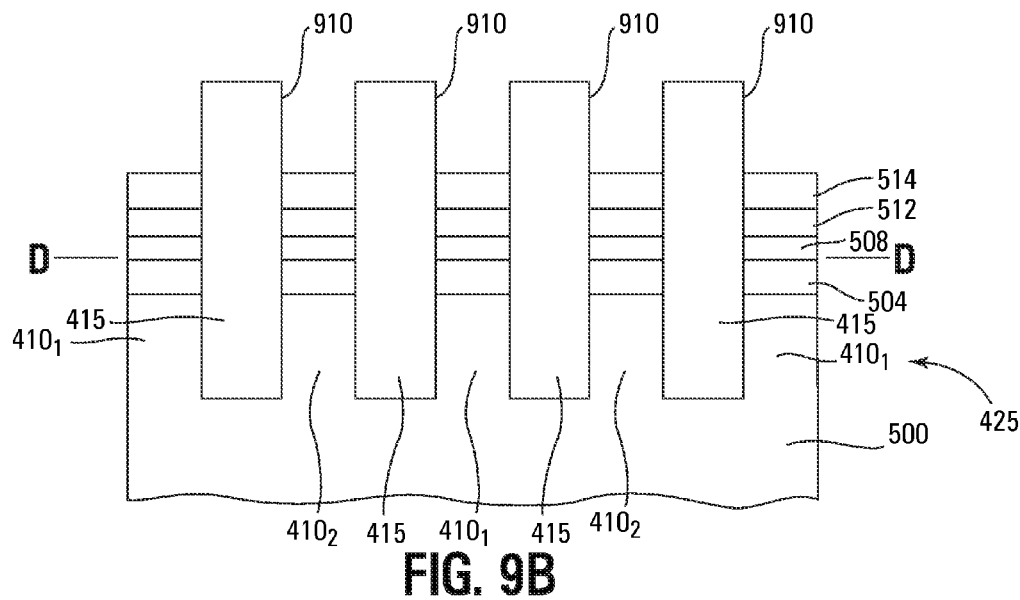
Figure 9C:
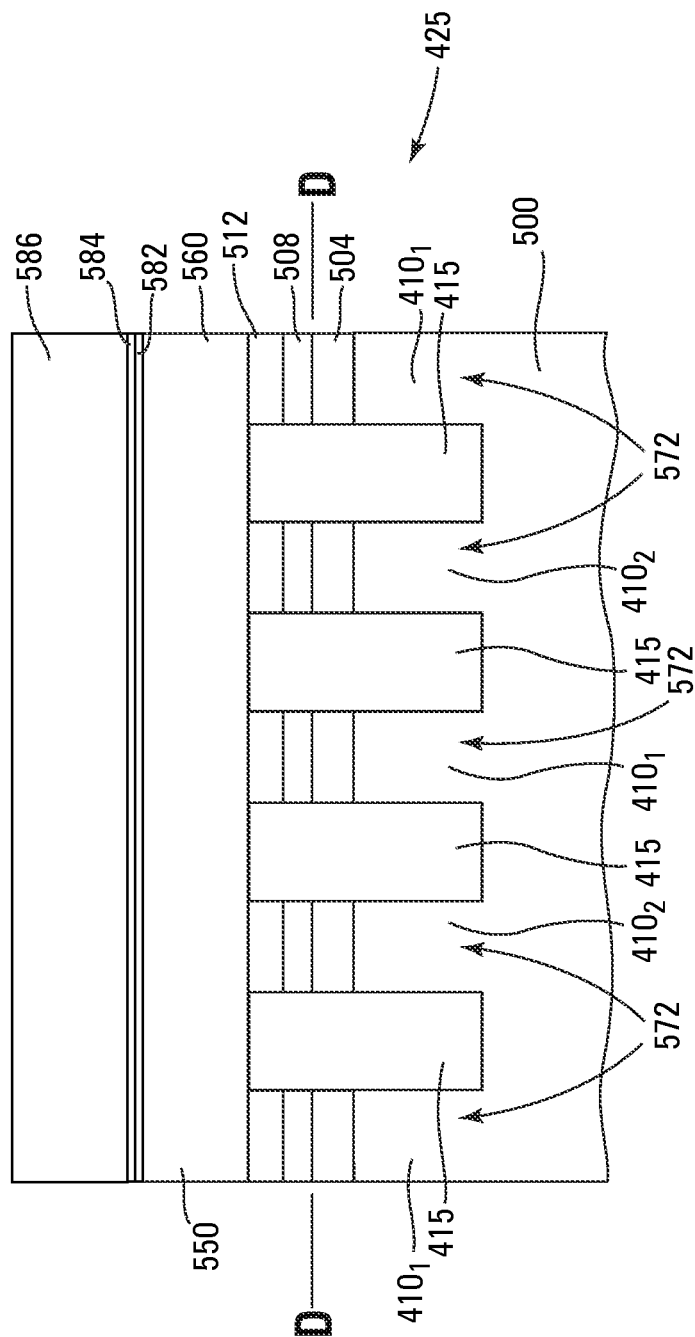
Figure 11:
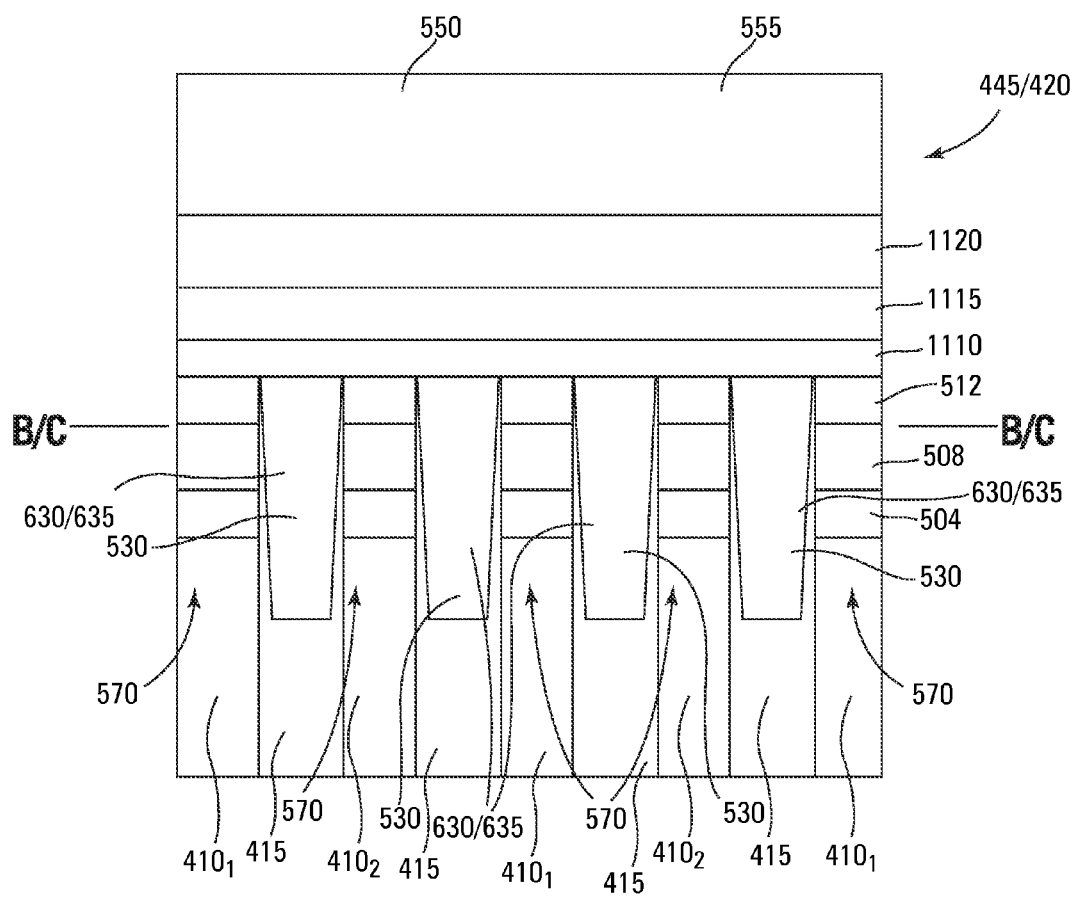
FIG. 11 shows a cross-section viewed along lines B-B and C-C in FIG. 4 during a stage of fabrication, according to another embodiment.
Figure 12:
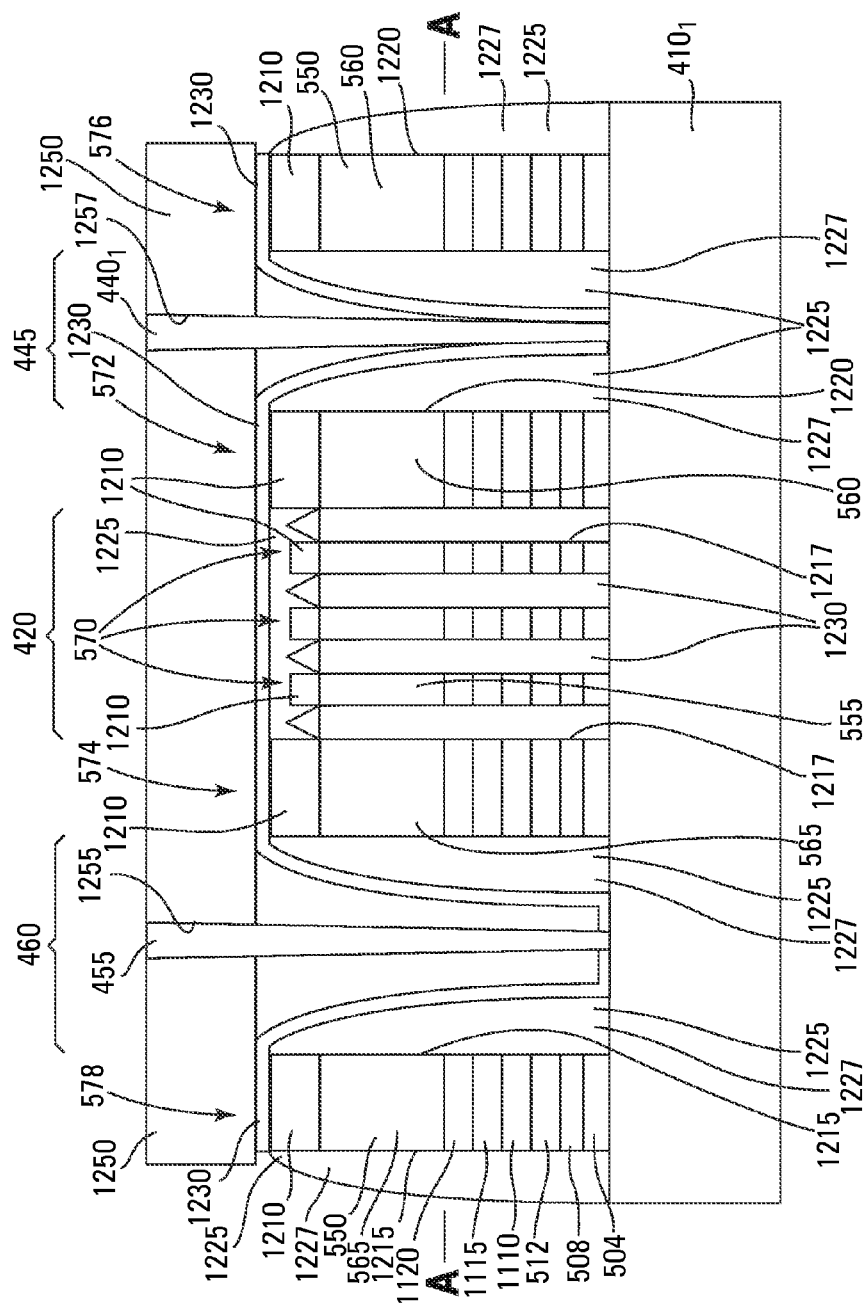
FIG. 12 shows a cross-section viewed along line A-A in FIG. 4 during a stage of fabrication, according to another embodiment.

FIGS. 5A-5F show a cross-section viewed along line A-A in FIG. 4 during various stages of fabrication. FIG. 6A shows a cross-section viewed along lines B-B, C-C, and D-D in FIG. 4 during a stage of fabrication. FIGS. 6B-6F show a cross-section viewed along lines B-B and C-C in FIG. 4 during various stages of fabrication. FIGS. 6G-6H show a cross-section viewed along line B-B in FIG. 4 during various stages of fabrication. FIGS. 7A-7G show a cross-section viewed along line E-E in FIG. 4 during various stages of fabrication. FIG. 8 shows a cross-section viewed along line C-C during a stage of fabrication. FIGS. 9A-9C show a cross-section viewed along line D-D in FIG. 4 during various stages of fabrication. FIG. 11 shows a cross-section viewed along lines B-B and C-C in FIG. 4 during a stage of fabrication. FIG. 12 shows a cross-section viewed along line A-A in FIG. 4 during a stage of fabrication.

Figure 5A:
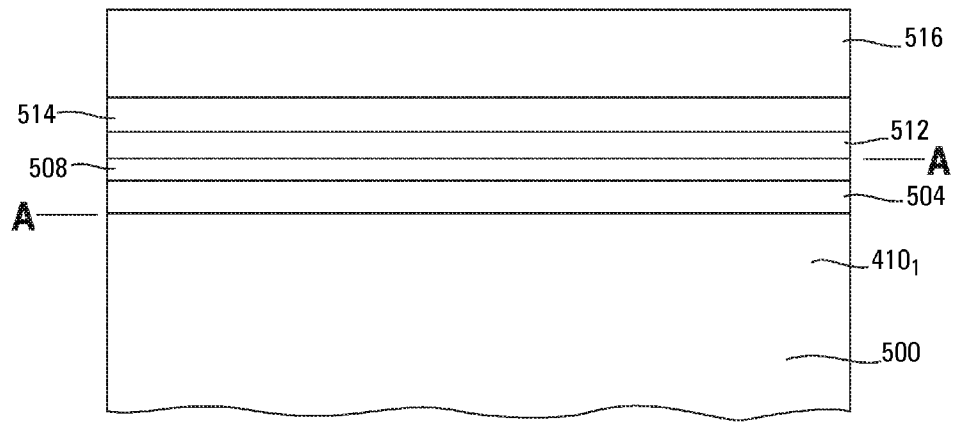
FIGS. 5A-5F show a cross-section viewed along line A-A in FIG. 4 during various stages of fabrication, according to an embodiment.
Figure 6A:
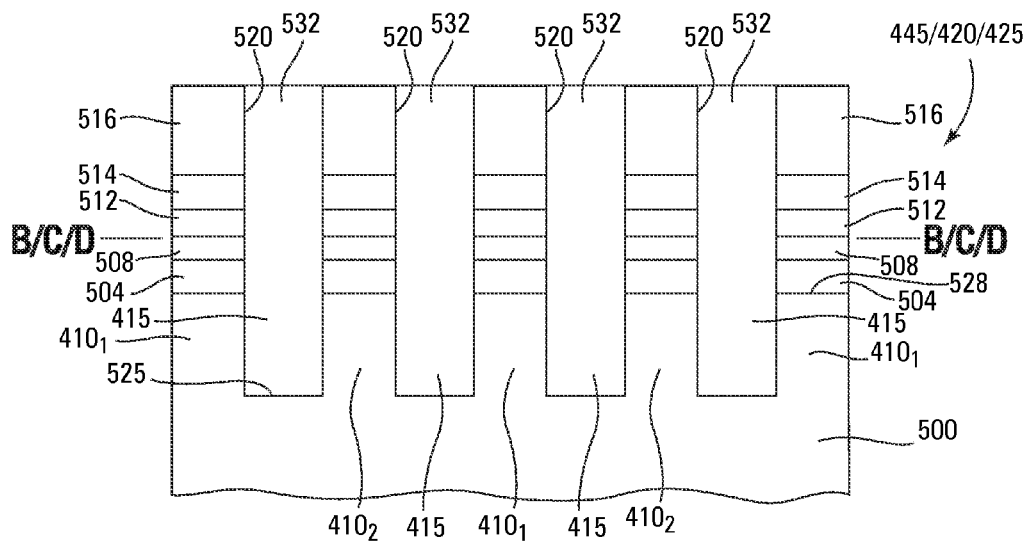
FIG. 6A shows a cross-section viewed along lines B-B, C-C, and D-D in FIG. 4 during a stage of fabrication, according to another embodiment.
Figure 7A:
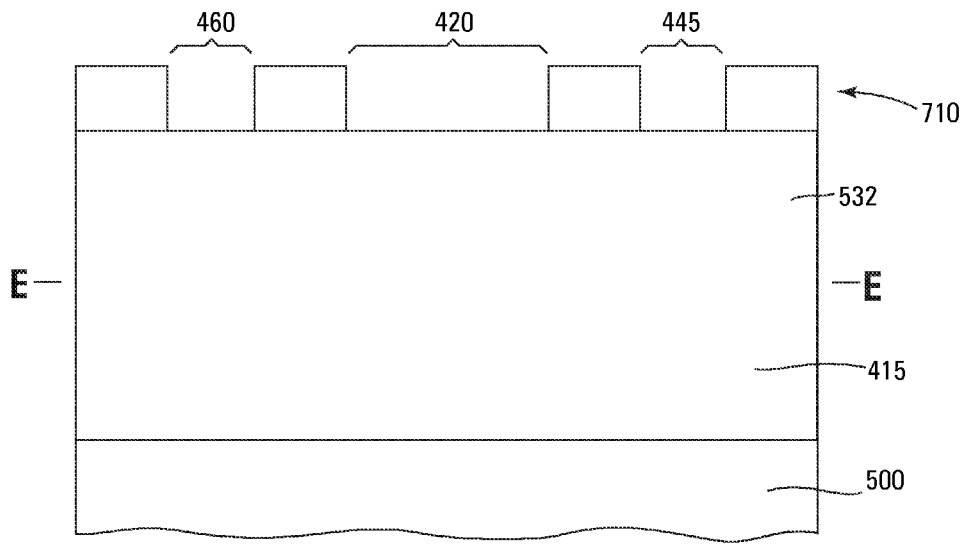
FIGS. 7A-7G show a cross-section viewed along line E-E in FIG. 4 during various stages of fabrication, according to another embodiment.

FIGS. 5A, 6A, and 7A correspond to substantially the same stage of fabrication and depict their respective cross-sections after several processing steps have occurred. Note that the cross-sections viewed along lines B-B, C-C, and D-D in FIG. 4 may have the structure depicted in FIG. 6A.

In general, for some embodiments, a dielectric 504 (e.g., a tunnel dielectric) may be formed over a semiconductor 500, as shown in FIGS. 5A and 6A. Semiconductor 500 may be comprised of silicon, e.g., monocrystalline silicon, that may be conductively doped to have p-type conductivity, e.g., to form a p-well, or n-type conductivity, e.g., to form an n-well. Dielectric 504 is generally formed of one or more dielectric materials. For example, dielectric 504 may be formed from an oxide, e.g., silicon oxide, an oxynitride, e.g., silicon oxynitride, etc.

A charge-storage structure 508 may be formed over dielectric 504, as shown in FIGS. 5A and 6A. Charge-storage structure 508 is generally formed of one or more materials capable of storing a charge. Charge-storage structure 508 may be a floating gate formed from a conductor. The conductor may comprise, consist of, or consist essentially of conductively doped polysilicon and/or may comprise, consist of, or consist essentially of metal, such as a refractory metal, or a metal-containing material, such as a refractory metal silicide, or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

For other embodiments, charge-storage structure 508 may be a charge trap. For example, the charge trap may be a dielectric, e.g., a high-dielectric-constant (high-K) dielectric, such as alumina ($Al_2O_3$), with embedded conductive particles (e.g., nano-dots), such as embedded metal particles or embedded nano-crystals (e.g., silicon, germanium, or metal crystals), a silicon-rich dielectric, or $SiON/Si_3N_4$. Other charge-storage structures are also known.

A dielectric 512 may be formed over charge-storage structure 508, as shown in FIGS. 5A and 6A. Dielectric 512 may be generally formed of one or more dielectric materials. For some embodiments, dielectric 512 may comprise, consist of, or consist essentially of one or more dielectrics, such as silicon oxide, nitride, oxynitride, oxide-nitride-oxide (ONO), high dielectric constant (high-K) dielectrics, such as alumina, hafnia ($HfO_2$), zirconia ($ZrO_2$), praeseodymium oxide ($Pr_2O_3$), or other dielectrics.

One or more sacrificial materials may be formed over dielectric 512. In the example of FIGS. 5A and 6A, a sacrificial material 514, such as an oxide, e.g., silicon dioxide, may be formed over dielectric 512. A sacrificial material 516, such as polysilicon, nitride, etc., may then be formed over sacrificial material 514. In general, sacrificial materials 514 and 516 are different materials and may be chosen to protect and/or pattern underlying layers while allowing their subsequent selective removal.

Openings 520, such as trenches, may then be formed, as shown in FIG. 6A, by patterning sacrificial material 516 and removing portions of sacrificial material 514, dielectric 512, charge-storage structure 508, dielectric 504, and semiconductor 500 exposed by the patterned sacrificial material 516. For example, for some embodiments, a mask (not shown), e.g., imaging resist, such as photo-resist, may be formed over sacrificial material 516 and patterned to define regions of sacrificial material 516, sacrificial material 514, dielectric 512, charge-storage structure 508, dielectric 504, and semiconductor 500 for removal. The regions defined for removal are subsequently removed, e.g., by etching, to form openings 520 that may terminate within semiconductor 500. For example, openings 520 may expose a surface 525 of semiconductor 500 located within semiconductor 500 at a level (e.g., vertical level) below an upper surface 528 of semiconductor 500.

Openings 520 define active regions 410, such as active regions $410_1$ and $410_2$, therebetween under dielectric 504 within semiconductor 500, as shown in FIG. 6A. That is, active regions 410 are portions of semiconductor 500. Each active region 410 may form a channel region for a corresponding column of memory cells, e.g., a string of series coupled memory cells, to be formed thereover. In other words, during operation of one or more memory cells of a column of memory cells, such as a string of memory cells, a channel can be formed in the corresponding active region 410. The memory cells formed over each active region may include dielectric 512 (e.g., as an interlayer dielectric), charge-storage structure 508, and dielectric 504 (e.g., as a tunnel dielectric).

A dielectric 532 may be deposited in openings 520, e.g., over exposed surface 525, and possibly over sacrificial material 516, such as by blanket deposition, to form isolation regions 415 from dielectric 532 between the active regions 410, as shown in FIG. 6A. Dielectric 532 may then be removed from sacrificial material 516, e.g., by chemical mechanical planarization (CMP), exposing an upper surface of sacrificial material 516 so that the upper surfaces of isolation regions 415 are substantially flush (e.g., flush) with the upper surface of sacrificial material 516. For example, dielectric 532 may substantially (e.g., completely) fill openings 520.

Dielectric 532 is generally formed of one or more dielectric materials. For example, dielectric 532 may include an oxide, e.g., a thermal oxide and/or a high-density-plasma (HDP) oxide, or a spin-on dielectric material, e.g., hydrogen silsesquioxane (HSQ), perhydropolysilazane, hexamethyldisiloxane, octamethyltrisiloxane, etc. In some embodiments, dielectric 532 may include polysilazane spin-on-dielectric from AZ Electronics Materials (Branchburg, N.J., U.S.A.).

For some embodiments, the processing steps described above in conjunction with FIGS. 5A and 6A may form the cross-sections of FIGS. 5A and 6A and the cross-section of FIG. 7A, which illustrates an isolation region 415.

For some embodiments, a mask 710, e.g., imaging resist, such as photo-resist, may be formed over each isolation region 415, as shown in FIG. 7A for a given isolation region 415. Mask 710 may be patterned to define regions of each isolation region 415 for removal. For example, the regions defined for removal may correspond to string region 420, source/drain zone 445, and source/drain zone 460, whereas the regions protected by patterned mask 710 may correspond to drain-select-gate regions 425 and 450, respectively denoted by indicia $SG_1$ and $SG_3$, and to source-select-gate regions 430 and 470, respectively denoted by indicia $SG_2$ and $SG_4$, as shown in FIG. 7B.

Figure 7B:
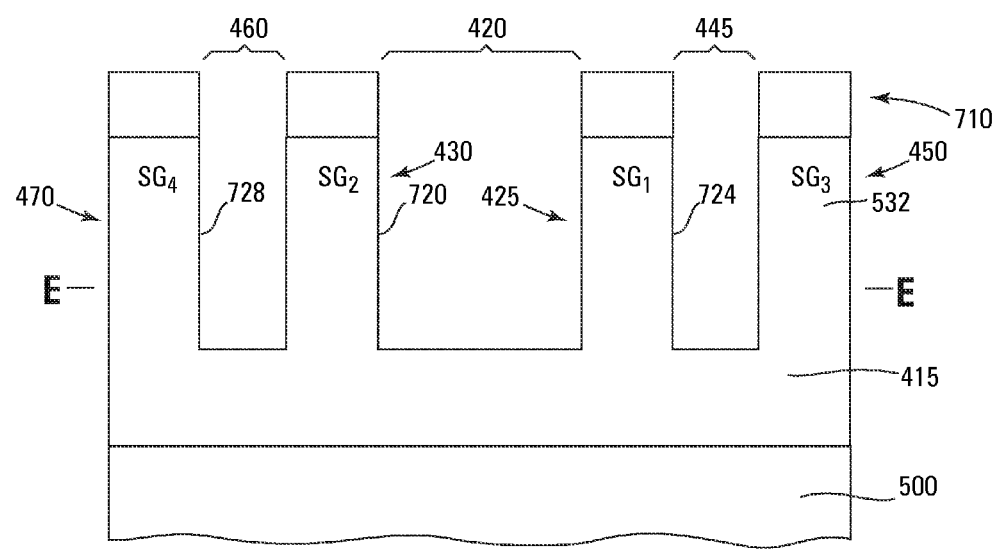

Subsequently, the regions defined for removal are removed, such as by etching (e.g., an etch-back), stopping within the isolation region 415, as shown in FIG. 7B. Portions of the isolation region 415 corresponding to string region 420, source/drain zone 445, and source/drain zone 460 are removed, leaving the portions of the isolation region 415 corresponding to drain-select-gate regions 425 and 450 and source-select-gate regions 430 and 470 substantially intact. For example, the removal process may form openings 720, 724, and 728 within the portions of the isolation region 415 respectively corresponding to string region 420, source/drain zone 445, and source/drain zone 460, as shown in FIG. 7B. In other words, the removal process may recess the portions of the isolation region 415 respectively corresponding to string region 420, source/drain zone 445, and source/drain zone 460 to form the openings 720, 724, and 728.

Figure 6B:
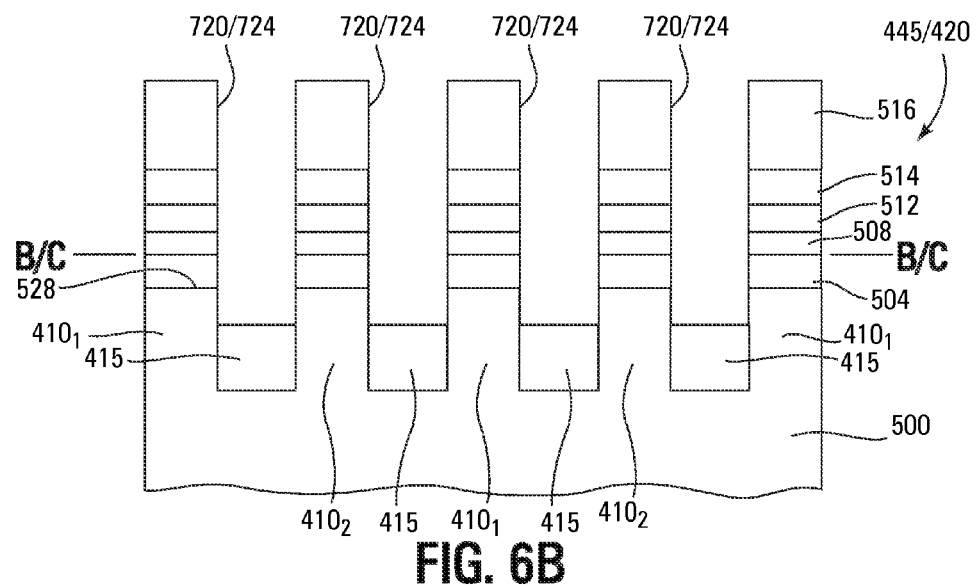
FIGS. 6B-6F show a cross-section viewed along lines B-B and C-C in FIG. 4 during various stages of fabrication, according to another embodiment.

FIG. 6B shows that the removal process may remove portions of the isolation regions between active regions 410 to form openings 720/724, where openings 720 are in the cross-section viewed along line B-B (in source/drain zone 445) in FIG. 4 and openings 724 are in the cross-section viewed along line C-C (in string region 420) in FIG. 4. Note that the cross-sections viewed along lines B-B and C-C in FIG. 4 may both have the structure depicted in FIG. 6B. For some embodiments, openings 720/724 may be tapered (e.g., becoming narrower toward their bottoms) so as to leave remaining portions of isolation regions 415 adjacent to the sidewalls of openings 720/724, and thus sidewalls of charge-storage structure 508, dielectric 504, and at least a portion of dielectric 512 (FIG. 11).

For some embodiments, openings 720/724 may pass through sacrificial materials 516 and 514, through dielectric 512, through charge-storage structure 508, through dielectric 504, and extend to a level (e.g., vertical level) below the upper surface 528 of semiconductor 500, and thus of active regions 410. This means that the removal process may terminate in each isolation region at a level (e.g., vertical level) below the upper surface 528 of active regions 410. In other words, the portions of each isolation 415 in source/drain zone 445 and string region 420 may be recessed below the upper surface 528 of active regions 410.

Note that the portion of mask 710 over drain-select-gate region 425 in FIGS. 7A and 7B causes the cross-section in FIG. 6A viewed along line D-D (drain-select-gate region 425) in FIG. 4 to remain substantially as shown in FIG. 6A, i.e., the isolation regions 415 remain substantially intact in drain-select-gate region 425.

Figure 5B:
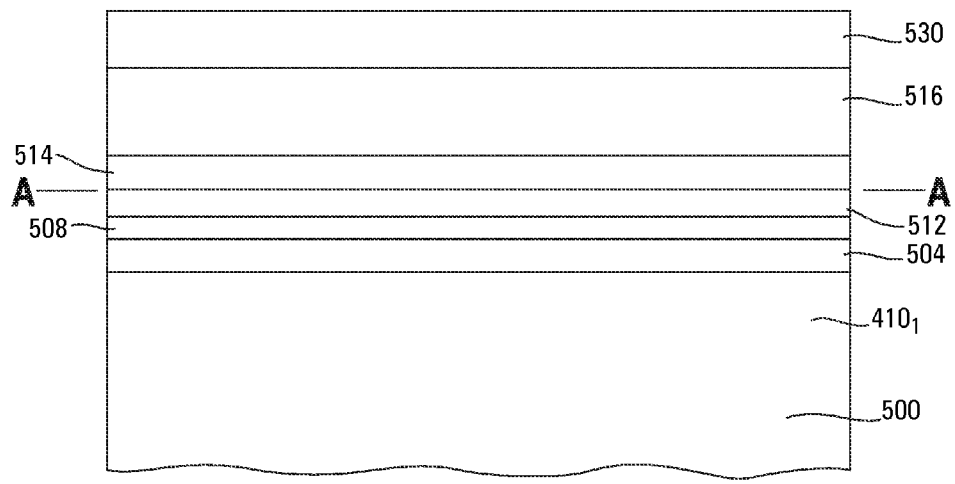
Figure 6C:
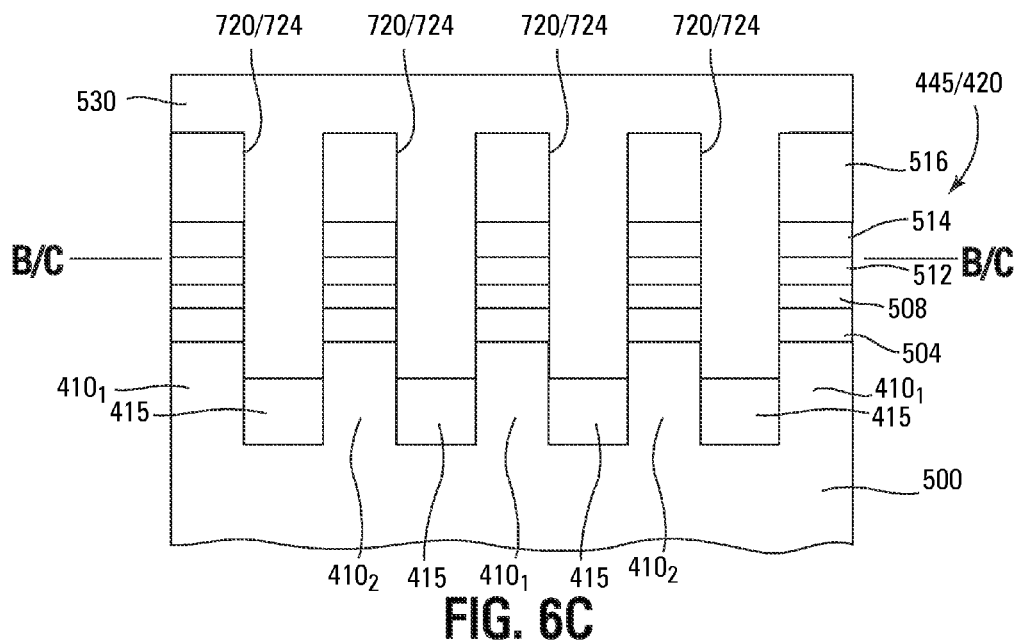

A dielectric 530 may be formed over sacrificial material 516 in FIGS. 5B and 6C. Note that the cross-sections viewed along line B-B in source/drain zone 445 in FIG. 4 and line C-C in string region 420 in FIG. 4 may have the structure depicted in FIG. 6C. Dielectric 530 may also be formed over isolation regions 415 in FIG. 6C within openings 720/724, and may thus overfill openings 720/724. For example, the dielectric 530 may be over the upper surfaces of sacrificial material 516 and within openings 720/724 over the sides of sacrificial materials 516 and 514, the sides of dielectric 512, the sides of charge-storage structure 508, and the sides of dielectric 504 and over the recessed portions of each isolation region 415, as shown in FIG. 6C.

For embodiments, where openings 720/724 may be tapered so as to leave remaining portions of isolation regions 415 adjacent to the sidewalls of charge-storage structure 508, dielectric 504, and at least a portion of dielectric 512, the remaining portions of the isolation solation regions 415 may be between dielectric 530 and sidewalls of charge-storage structure 508, dielectric 504, and at least a portion of dielectric 512. This is shown in FIG. 11, for example.

Figure 7C:
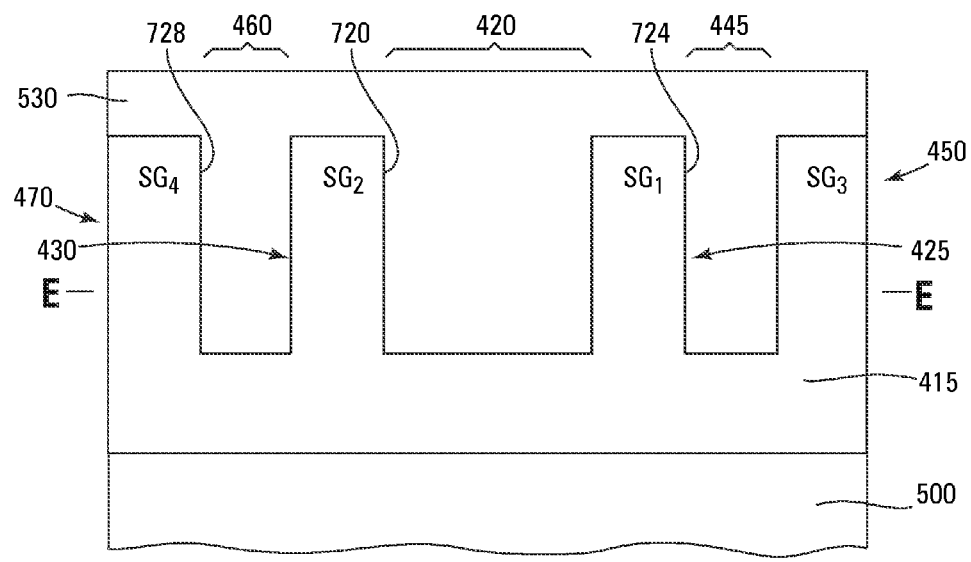

Dielectric 530 may also be formed over the isolation region 415 of FIG. 7B after removing mask 710, as shown in FIG. 7C. Dielectric 530 may be formed in the openings 720, 724, and 728 within the portions of the isolation region 415 respectively corresponding to string region 420, source/drain zone 445, and source/drain zone 460, as shown in FIG. 7C. For example, dielectric 530 may overfill openings 720, 724, and 728 and extend over the upper surfaces of isolation region 415 that correspond to drain-select-gate regions 425 and 450, respectively denoted by indicia $SG_1$ and $SG_3$, and to source-select-gate regions 430 and 470, respectively denoted by indicia $SG_2$ and $SG_4$.

Dielectric 530 may be further formed over the structure of FIG. 6A, e.g., in drain-select-gate region 425, corresponding to the cross-section in FIG. 6A viewed along line D-D in FIG. 4, as shown in FIG. 9A. For example, dielectric 530 may be formed over the upper surfaces of isolation regions 415 and the upper surfaces of portions of sacrificial material 516.

Recall that the portion of mask 710 over drain-select-gate region 425 in FIGS. 7A and 7B causes the structure in FIG. 6A, corresponding to drain-select-gate region 425 (the cross-section viewed along D-D in FIG. 4), to remain substantially as shown in FIG. 6A during the removal of the portions of the isolation region 415 in FIG. 7B corresponding to string region 420, source/drain zone 445, and source/drain zone 460 and during the removal in FIG. 6B of the portions of isolation regions 415 in string region 420 (the cross-section viewed along line C-C in FIG. 4) and of the portions of isolation region 415 in source/drain zone 445 (the cross-section viewed along line B-B in FIG. 4). As such, FIG. 9A shows the structure in drain-select-gate region 425 (the cross-section viewed along line D-D) at a stage of fabrication following the stage of fabrication depicted in FIG. 6B and in FIG. 7B.

Dielectric 530 is generally formed of one or more dielectric materials. For some embodiments, dielectric 530 may be formed from a material having a lower removal rate than the isolation regions 415 for a particular isotropic removal chemistry. For example, the dielectric 530 may be formed from a material that etches about 10 times (e.g., at least 10 times) slower than isolation regions 415, such as about 10 times (e.g., at least 10 times) slower than oxide using a particular etchant selective to oxide. For example, dielectric 530 may be formed from nitride.

Figure 5C:
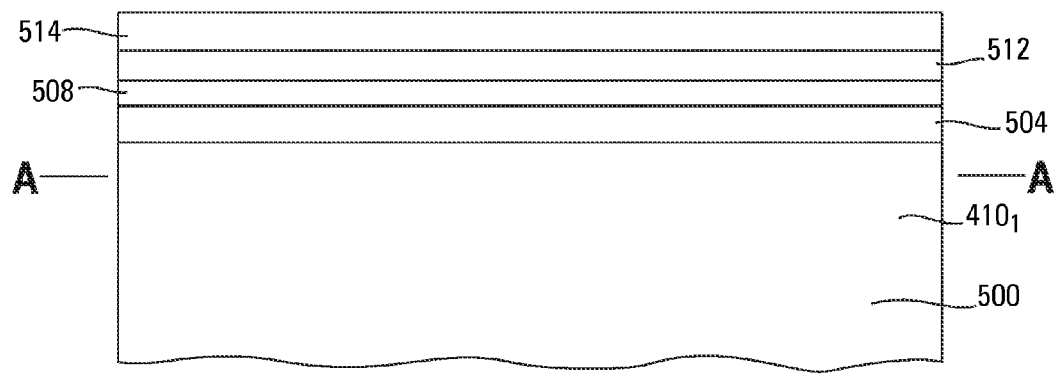
Figure 6D:
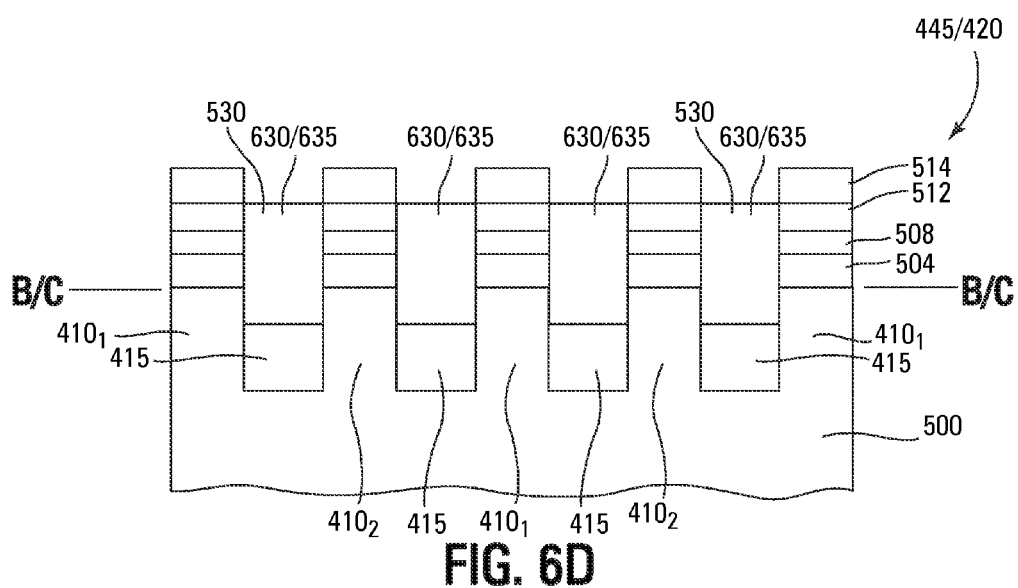

Subsequently, dielectric 530 and sacrificial material 516 may be removed, e.g., by etching, to expose sacrificial material 514, as shown in FIGS. 5C and 6D. Note that the cross-sections viewed along lines B-B and C-C in FIG. 4 may both have the structure depicted in FIG. 6D. For example, the removal process may recess portions of dielectric 530 over isolation regions 415 in string region 420 (the cross-section viewed along line C-C in FIG. 4) and in source/drain zone 445 (the cross-section viewed along line B-B in FIG. 4) below upper surfaces of adjacent portions of sacrificial material 514 that are over active regions 410, as shown in FIG. 6D.

Figure 7D:
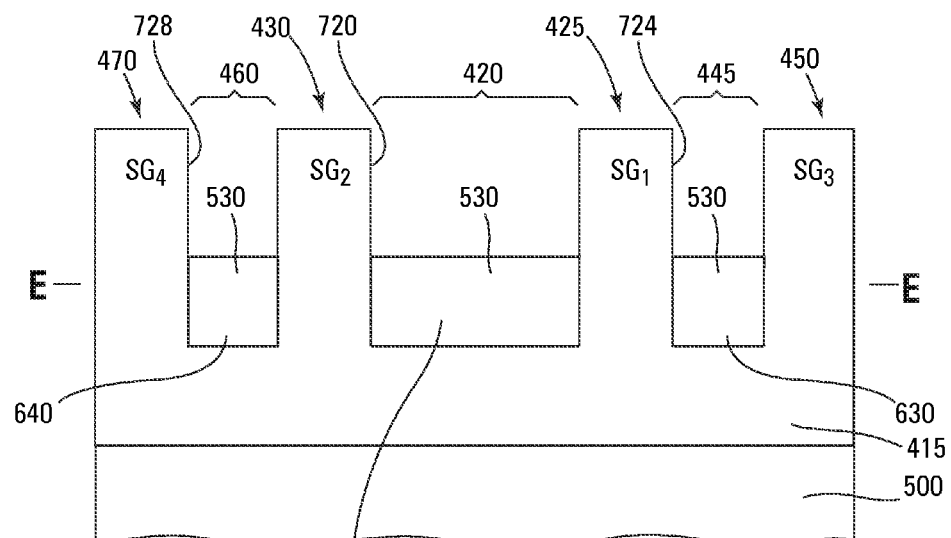

The removal process may remove dielectric 530 from over the portions of the isolation region 415 in FIG. 7D, corresponding to drain-select-gate regions 425 and 450 and to source-select-gate regions 430 and 470. In other words, the removal process recesses dielectric 530 within openings 720, 724, and 728 to a vertical level below the upper surfaces of the portions of each isolation region 415 corresponding to drain-select-gate regions 425 and 450 and to source-select-gate regions 430 and 470.

For example, the removal process forms solid dielectric (e.g., nitride) plugs 630 from the dielectric 530 over the recessed portion of each isolation region 415 in source/drain zone 445 and solid dielectric (e.g., nitride) plugs 635 from the dielectric 530 over the recessed portion of each isolation region 415 in string region 420, as shown in FIGS. 6D and 7D, and forms solid dielectric (e.g., nitride) plugs 640 from the dielectric 530 over the recessed portion of each isolation region 415 in source/drain zone 460, as shown in FIG. 7D. In other words, a dielectric plug 630 is formed in opening 724, a dielectric plug 635 is formed in opening 720, and dielectric plug 640 is formed in opening 728, as shown in FIG. 7D.

Figure 5D:
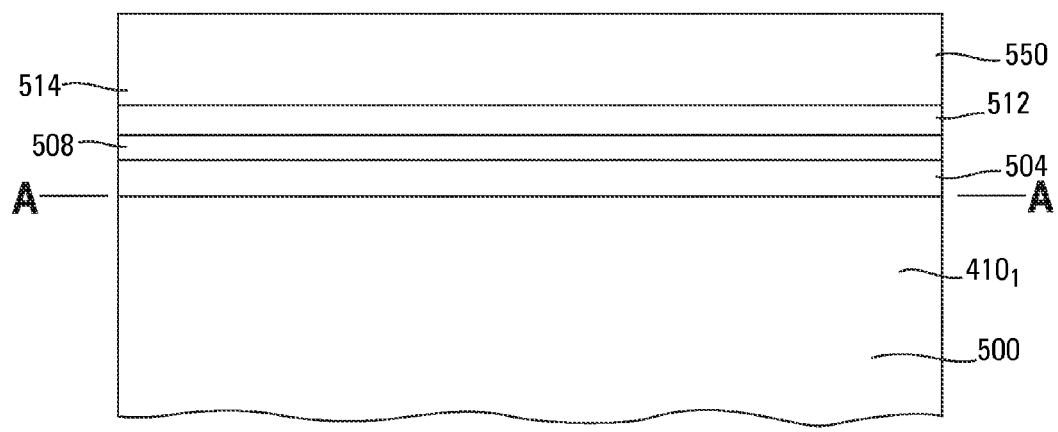
Figure 6E:
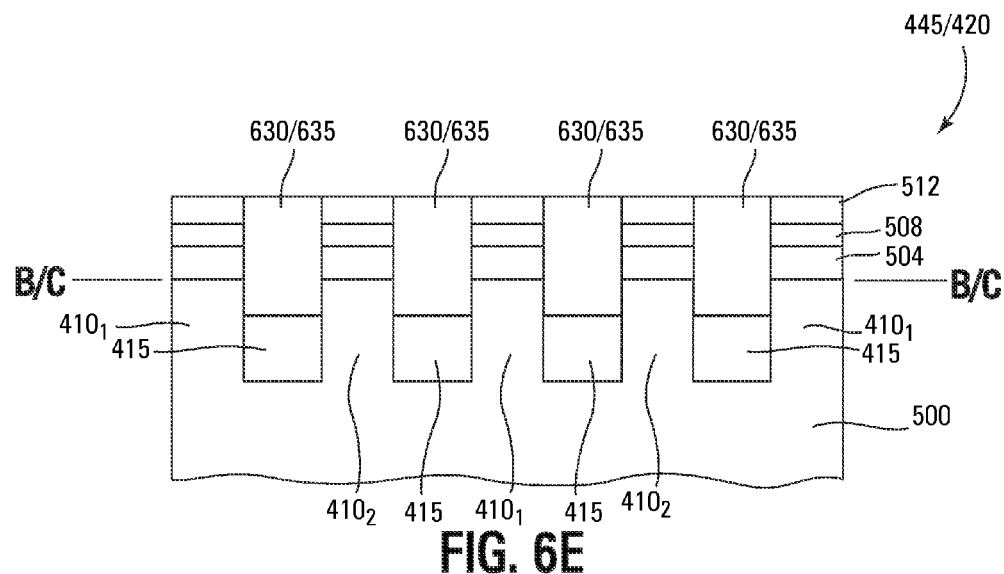

The removal process may also remove dielectric 530 and the portions of sacrificial material 516 between isolation regions 415 in drain-select-gate region 425 in FIG. 9B, stopping on or within sacrificial material 514 in FIG. 9B (e.g., in drain-select-gate region 425) to expose sacrificial material 514. For example, the removal of the portions of sacrificial material 516 between isolation regions 415 may form openings 910 in drain-select-gate region 425 that terminate at or within sacrificial material 514. Sacrificial material 514 may then be removed, e.g., by etching, stopping on or within dielectric 512, thereby exposing dielectric 512, as shown in FIGS. 5D, 6E, and 9C. Note that source/drain zone 445 and string region 420 (the cross-sections viewed along lines B-B and C-C in FIG. 4) may both have the structure depicted in FIG. 6E.

Figure 7E:
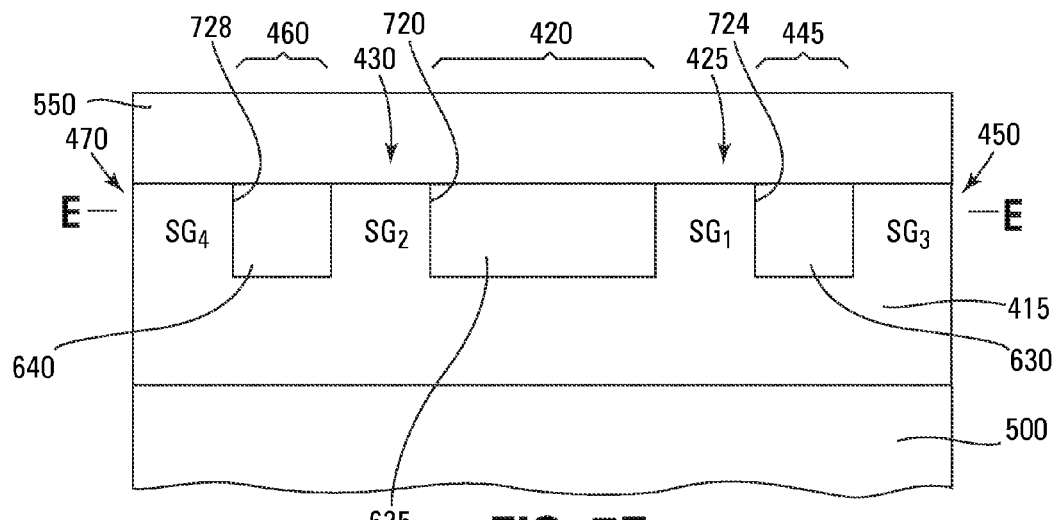

Portions of isolation regions 415 may also be removed, e.g., by etching, as shown in FIGS. 7E, and 9C. For example, the portions of isolation regions 415 may be removed (e.g., recessed) in FIG. 7E to a level of the upper surfaces of dielectric plugs 630, 635, and 640 respectively within openings 720, 724, and 728 so that the upper surfaces of dielectric plugs 630, 635, and 640 may be substantially flush (e.g., flush) with the upper surfaces of the portions of each isolation region 415 corresponding to drain-select-gate regions 425 and 450 and to source-select-gate regions 430 and 470. As shown in the example of FIG. 9C, the portions of isolation regions 415 may be removed (e.g., recessed) to a level of the upper surface of dielectric 512 so that the upper surface of dielectric 512 is substantially flush (e.g., flush) with the upper surfaces of the of the isolation regions 415 in drain-select gate region 425.

Figure 6F:
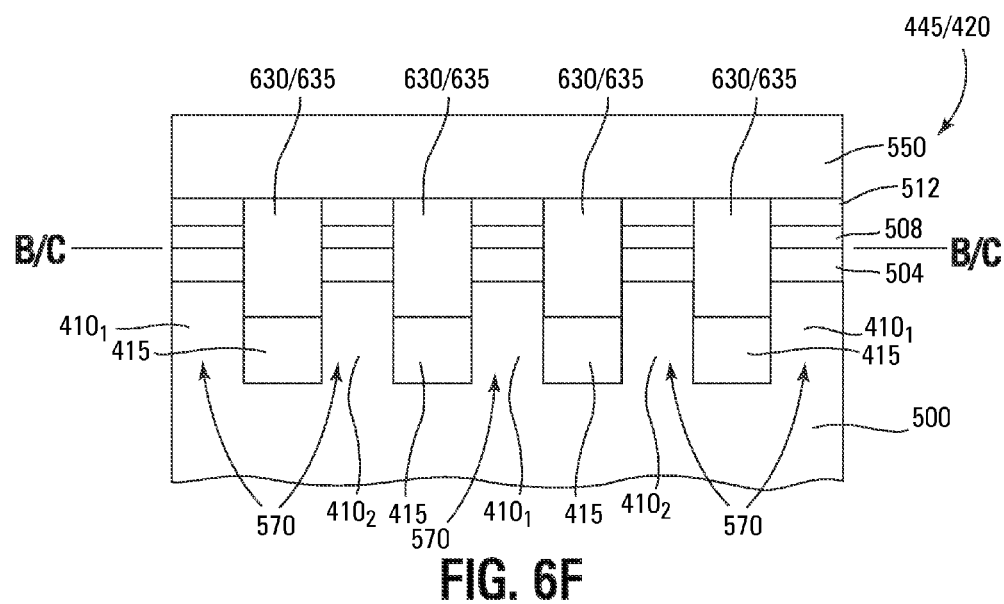
Figure 6G:
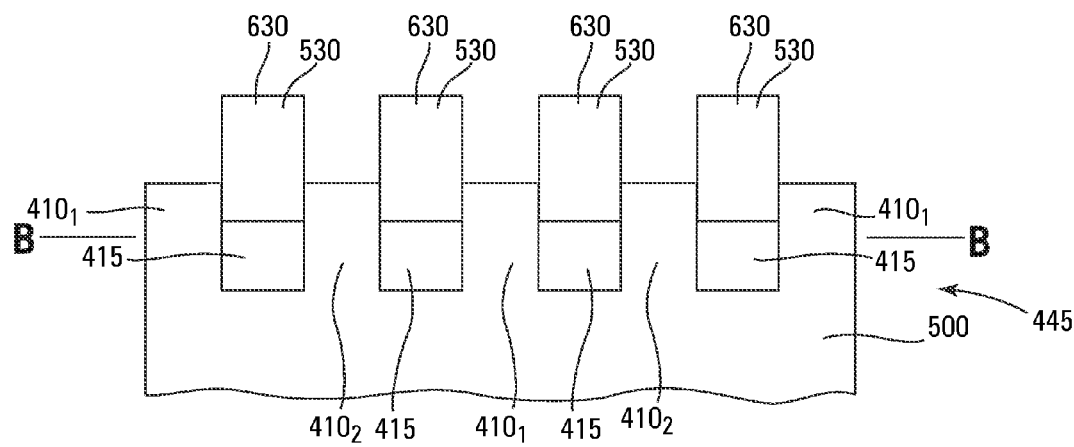
FIGS. 6G-6H show a cross-section viewed along line B-B in FIG. 4 during various stages of fabrication, according to another embodiment.
Figure 6H:
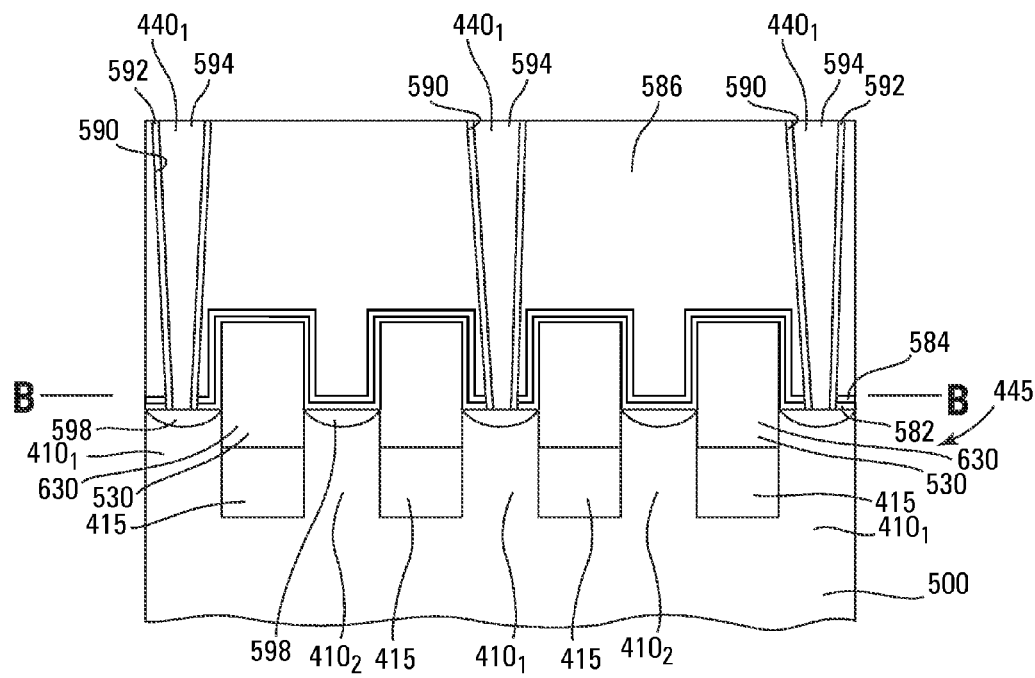

A conductor 550 may then be formed over dielectric 512, as shown in FIGS. 5D, 6F, and 9C. Conductor 550 may also be over isolation regions 415 in FIG. 9C and over dielectric plugs 630/635 in FIG. 6F. Note that source/drain zone 445 and string region 420 (the cross-sections viewed along lines B-B and C-C in FIG. 4) may both have the structure depicted in FIG. 6F.

For other embodiments, a dielectric 1110 may be formed over dielectric 512 and dielectric plugs 630/635, as shown in FIG. 11. Dielectric 1110 may be generally formed of one or more dielectric materials. For some embodiments, dielectric 1110 may be an oxide such a silicon dioxide. Alternatively, dielectric 1110 may be a nitride.

Note that dielectric plugs 630/635 may be tapered (e.g., becoming narrower toward their respective bottoms), and portions of isolation regions 415 may be between dielectric plugs 630/635 and the sidewalls of charge-storage structure 508, dielectric 504, and at least a portion of dielectric 512. Portions of isolation region 415 may also be between sides of a tapered dielectric plug 630/635 and the active regions $410_1$ and $410_2$. For example, a portion of isolation region 415 between sides of a dielectric plug 630/635 and the active regions $410_1$ and $410_2$ may be tapered, becoming narrower toward its upper surface and the upper surface of the dielectric plug 630/635.

A dielectric 1115 may then be formed over dielectric 1110. Dielectric 1115 may be generally formed of one or more dielectric materials. For some embodiments, dielectric 1115 may be a high-dielectric-constant (high-K) dielectric, such as alumina, hafnia ($HfO_2$), or zirconia ($ZrO_2$) with a K of about 20, or praeseodymium oxide ($Pr_2O_3$) with a K of about 30. Alternatively, dielectric 1115 may be an oxide.

A conductor 1120, such as tantalum, may then be formed over dielectric 1115. Conductor 550 may then be formed over conductor 1120. Conductor 1120 may serve as a transition conductor between dielectric 1115, e.g., when dielectric 1115 is a high-K dielectric, and conductor 550.

Conductor 550 is generally formed of one or more conductive materials. For example, conductor 550 may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material.

Conductor 550 (or the stack in FIG. 11 including dielectrics 1110 and 1115, conductor 1120, and conductor 550) may be formed over the portions of each isolation region 415 corresponding to drain-select-gate regions 425 and 450 and to source-select-gate regions 430 and 470 and dielectric plugs 630, 635, and 640, as shown in FIG. 7E for just conductor 550. For some embodiments, conductor 550 may be in direct contact with the upper surfaces of the portions of each isolation region 415 corresponding to drain-select-gate regions 425 and 450 and to source-select-gate regions 430 and 470 and the upper surfaces of dielectric plugs 630, 635, and 640.

For other embodiments, dielectric 1110 may be in direct contact with the upper surfaces of the portions of each isolation region 415 corresponding to drain-select-gate regions 425 and 450 and to source-select-gate regions 430 and 470 and the upper surfaces of dielectric plugs 630, 635, and 640. Dielectric 1115 may then be over dielectric 1110. Conductor 1120 may be over dielectric 1115, and conductor 550 may be over conductor 1120. In other words, a stack including conductor 1120 over dielectric 1115 over dielectric 1110 may be between conductor 550 and dielectric plugs 630, 635, and 640 and the portions of isolation region 415 corresponding to drain-select-gate regions 425 and 450 and to source-select-gate regions 430 and 470 in FIG. 7E.

Figure 5E:
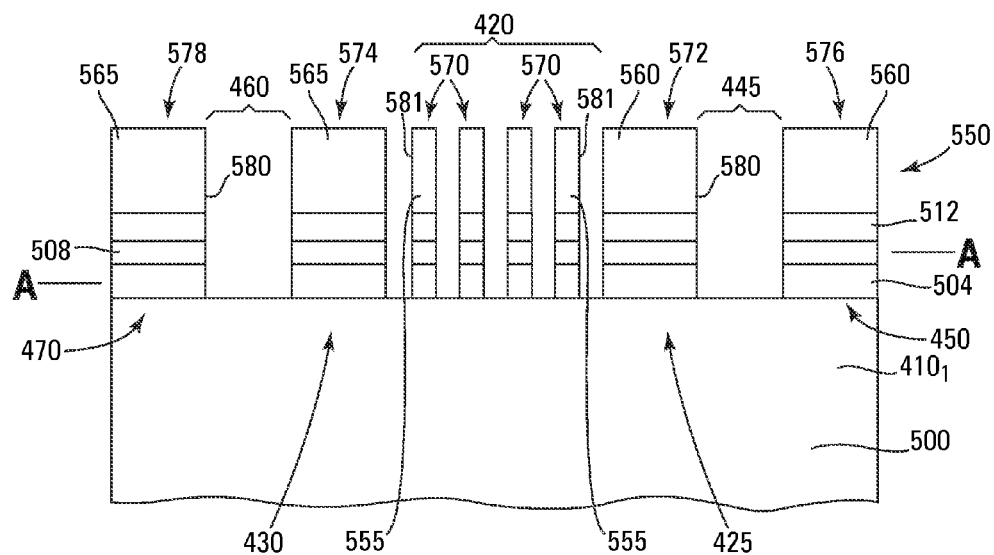
Figure 7F:
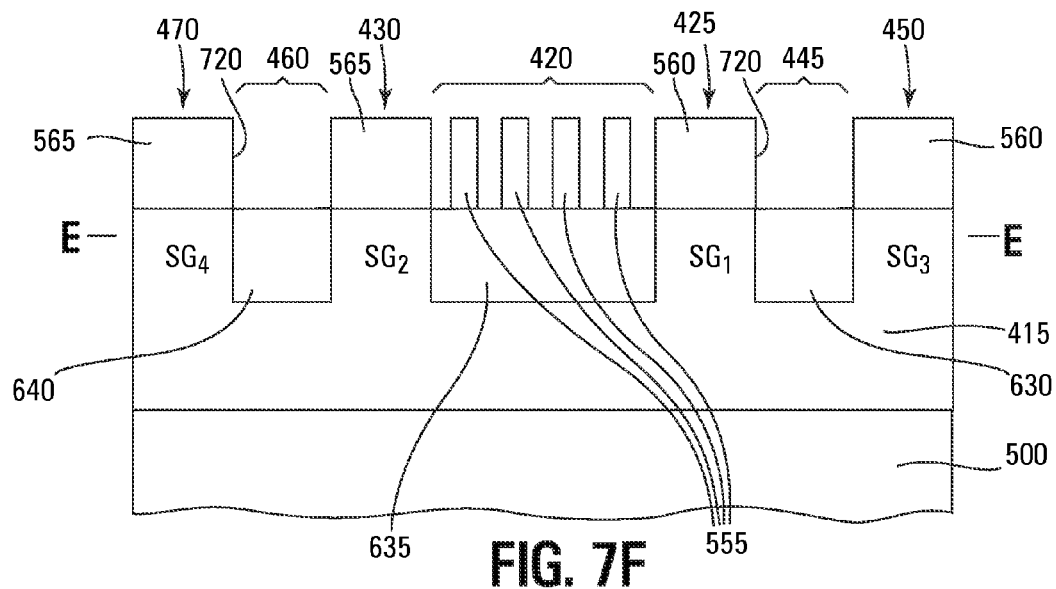

Conductor 550 may then be patterned and portions thereof removed, e.g., etched, to produce one or more individual access lines, such as one or more word lines 555, in string region 420, drain select lines 560 in drain-select-gate regions 425 and 450, and source select lines 565 in source-select-gate regions 430 and 470, as shown in FIGS. 5E, 7F and 9C.

Memory cells 570 may be located over active regions 410 in string region 420, as shown in FIGS. 5E, 6F, and 11. Memory cells 570 may be located above and substantially vertically aligned (e.g., vertically aligned), on a one-to-one basis, with active regions 410, as shown in FIGS. 6F and 11. FIGS. 6F and 11 may each depict a row of memory cells 570 that may be commonly coupled to a single word line 555. A memory cell 570 may include dielectric 504 (e.g., as a tunnel dielectric), charge-storage structure 508 over dielectric 504, dielectric 512 (e.g., as an interlayer dielectric) over charge-storage structure 508, and a control gate (e.g., as a portion of or coupled to a word line 555) over dielectric 512, as shown in FIGS. 5E and 6F.

Alternatively, e.g., in the example of FIG. 11, a memory cell 570 may include dielectric 504 (e.g., as a tunnel dielectric), charge-storage structure 508 over dielectric 504, dielectrics 512, 1110, and 1115, e.g., forming a blocking dielectric, such as an interlayer dielectric, over charge-storage structure 508, conductor 1120 over dielectric 1115, and conductor 550 over conductor 1120. In the example of FIG. 11, conductor 550 may form a word line 555, and conductor 1120 may be referred to as a control gate electrode of memory cells 570. For example, the control gate of the memory cell 570 may be a portion of or may be coupled to word line 555.

FIG. 5E depicts a string of series-coupled memory cells 570 within string region 420, e.g., of a column. This string of series-coupled memory cells 570 may be between and coupled in series with a drain select gate 572 at one end of the string, e.g., within drain-select-gate region 425, and a source select gate 574 at an opposite end of the string, e.g., within source-select-gate region 430. A drain select gate 576 may be within drain-select-gate region 450, and a source select gate 578 may be within source-select-gate region 470, as shown in FIG. 5E.

FIG. 9C depicts a row of drain select gates 572 within drain-select-gate region 425. Drain select gates 572 may be located above and substantially vertically aligned (e.g., vertically aligned), on a one-to-one basis, with active regions 410, as shown in FIG. 9C.

Drain select gates 572 and 576 may include dielectric 504 (e.g., as a gate dielectric) and a control gate (e.g., as a portion of or coupled to a drain select line 560). Source select gates 574 and 578 may include dielectric 504 (e.g., as a gate dielectric) and a control gate (e.g., as a portion of or coupled to a source select line 565).

Openings 580 may be formed through conductor 550 and through dielectric 512, charge-storage structure 508, and dielectric 504 within source/drain zone 445 and source/drain zone 460 in FIG. 5E, stopping on or within an active region 410 (e.g., active region $410_1$ in FIG. 5E) so as to expose that active region 410. That is, portions of conductor 550, dielectric 512, charge-storage structure 508, and dielectric 504 within source/drain zone 445 and source/drain zone 460 are removed to form openings 580.

Openings 581 may be formed through conductor 550 and through dielectric 512, charge-storage structure 508, and dielectric 504 within string region 420 in FIG. 5E, stopping on or within an active region 410. In other words, portions of conductor 550, dielectric 512, charge-storage structure 508, and dielectric 504 within string region 420 are removed to form openings 581, thus defining the memory cells 570.

Openings 720 may be formed through conductor 550 within source/drain zone 445 and source/drain zone 460 in FIG. 7F, stopping on or within dielectric 530 so as to expose dielectric plug 630 in source/drain zone 445 and dielectric plug 640 in source/drain zone 460. That is, portions of conductor 550 are removed to form openings 720. Openings 580 and 720 may be contiguous, e.g., contiguous portions of single openings (e.g., trenches) that may respectively span the cross-sections viewed along lines A-A and E-E in FIG. 4. For example, the single openings may at least extend from the cross-section viewed along line E-E in FIG. 4 to the cross-section viewed along line A-A in FIG. 4 in a direction substantially perpendicular to lines A-A and E-E (e.g., to the column direction) and substantially parallel to lines B-B, C-C, and D-D (e.g., to the row direction).

A portion of conductor 550 within source/drain zone 445 may also be removed from dielectric plugs 630 and dielectric 512 in FIG. 6G. For example, the conductor 550 may be removed from the structure in FIG. 6F corresponding to source/drain zone 445 (the cross-section in FIG. 6G viewed along line B-B in FIG. 4), exposing portions of dielectric plugs 630 and dielectric 512. Alternatively, for other embodiments, dielectrics 1110 and 1115, conductor 1120, and conductor 550 may be removed from the structure in FIG. 11, corresponding to a source/drain zone 445, to produce a structure similar to that in FIG. 6G, but with tapered dielectric plugs 630. For these embodiments, a portion of an isolation 415 may be between a given dielectric plug 630 and the active regions $410_1$ and $410_2$ on either side of that dielectric plug 630 and the isolation region 415.

For some embodiments, openings 580 and openings 720 may be formed through conductor 550 and the portion of conductor 550 within source/drain zone 445 may be removed from dielectric plugs 630 and dielectric 512 while portions of conductor 550 are removed in string region 420 (FIGS. 5E and 7F) to form word lines 555 from remaining portions of conductor 550 in string region 420. For example, openings 580 and openings 720 may be formed and the portion of conductor 550 within source/drain zone 445 may be removed from dielectric plugs 630 and dielectric 512 substantially concurrently with (e.g., concurrently with) the formation of word lines 555.

For other embodiments (e.g., where a stack including conductor 1120 over dielectric 1115 over dielectric 1110 may be under conductor 550), openings 580 and openings 720 may be formed through conductor 550, conductor 1120, and dielectrics 1115 and 1110. The portions of conductor 550, conductor 1120, and dielectrics 1115 and 1110 within source/drain zone 445 may be removed from dielectric plugs 630 and dielectric 512 while portions of conductor 550, conductor 1120, and dielectrics 1115 and 1110 are removed in string region 420 to form word lines 555 from remaining portions of conductor 550 in string region 420. For example, openings 580 and openings 720 may be formed and the portions of conductor 550, conductor 1120, and dielectrics 1115 and 1110 within source/drain zone 445 may be removed from dielectric plugs 630 and dielectric 512 substantially concurrently with (e.g., concurrently with) the formation of word lines 555.

Dielectric 512, charge-storage structure 508, and dielectric 504 may also be removed from active regions 410 in FIG. 6G, exposing active regions 410, so that portions of dielectric plugs 630 extend above upper surfaces of active regions 410. For example, dielectric 512, charge-storage structure 508, and dielectric 504 may be removed from the structure in FIG. 6F in source/drain zone 445 (the cross-section viewed along line B-B in FIG. 4), as shown in FIG. 6G.

However, the structure in FIG. 6F corresponding to the cross-section in string region 420 viewed along line C-C in FIG. 4 is protected and remains substantially as shown in FIG. 6F. Recall that the cross-sections viewed along lines B-B (source/drain zone 445) and C-C (string region 420) in FIG. 4 may have the structure depicted in FIG. 6F. FIG. 8 is a cross-section viewed along line C-C in FIG. 4 at a stage of fabrication following that depicted in FIG. 6F for the cross-section viewed along line C-C in FIG. 4, whereas FIG. 6G is a cross-section viewed along line B-B in FIG. 4 at a stage of fabrication following that depicted in FIG. 6F for the cross-section viewed along line B-B in FIG. 4.

Figure 5F:
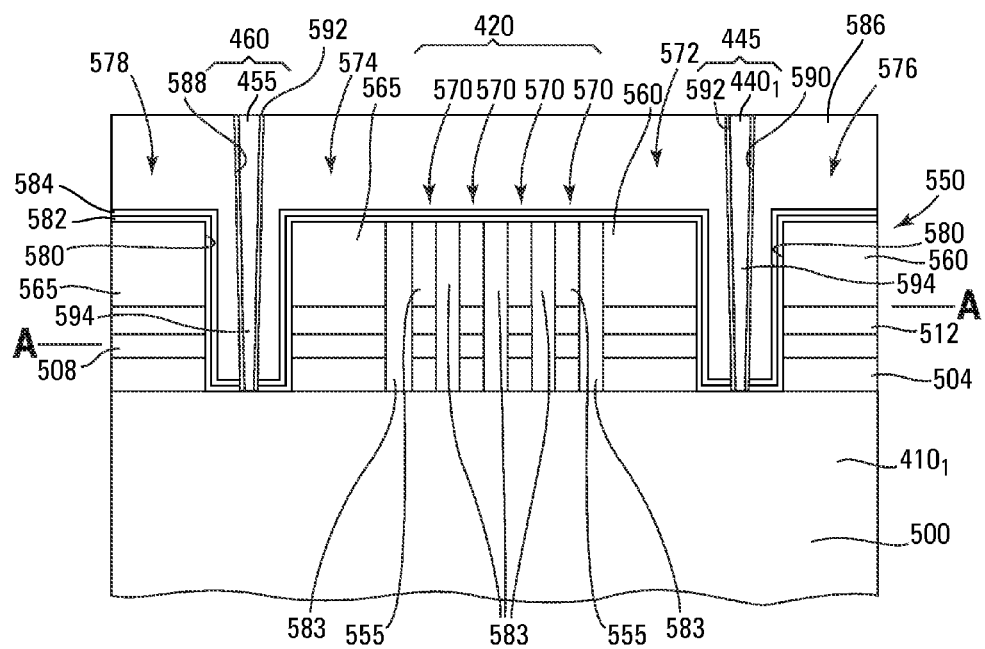
Figure 7G:
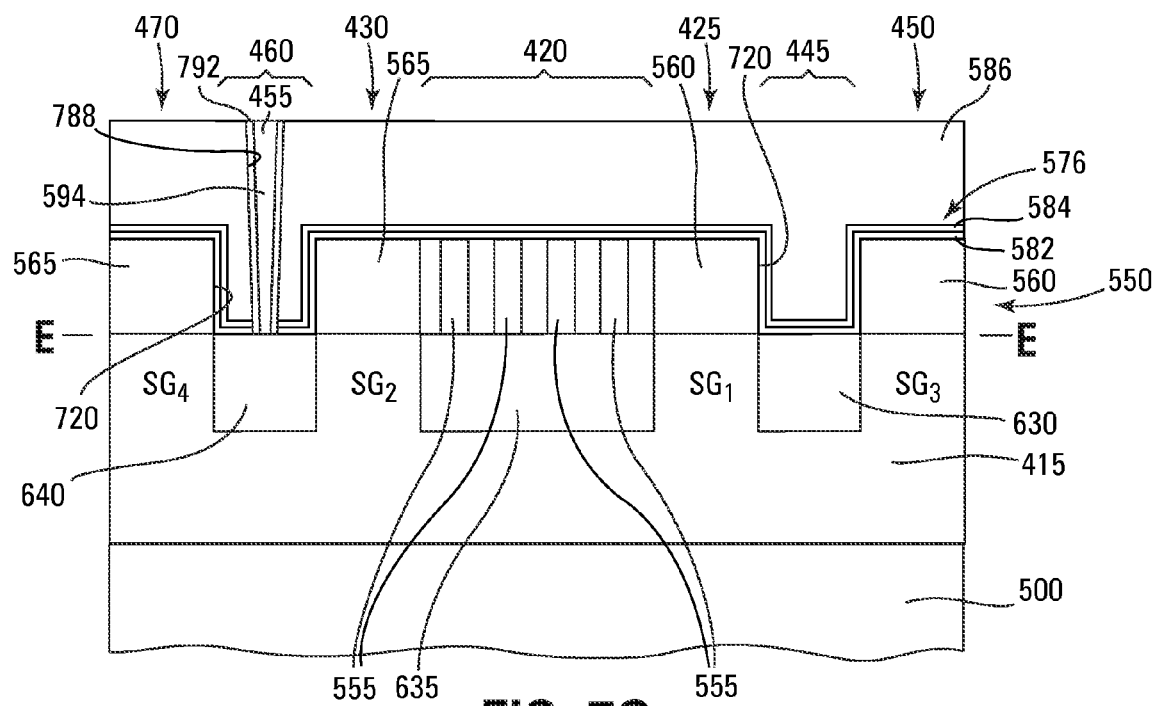

A dielectric 582 may be formed over conductor 550, e.g., over word lines 555, drain select lines 560, and source select lines 565, within openings 580 in FIG. 5F and over conductor 550, and within openings 720 in FIG. 7G. Dielectric 582 may line openings 580. For example, dielectric 582 may be over the sides of conductor 550, dielectric 512, charge-storage structure 508, and dielectric 504 and may be over active region 410 at the bottom of openings 580, as shown in FIG. 5F. Dielectric 582 may line openings 720. For example, dielectric 582 may be over the sides of conductor 550 and may be over dielectric plugs 630 and 640 at the bottom of openings 720, as shown in FIG. 7G. Dielectric 582 may be over the sides of word lines 555 and over dielectric plug 635 between word lines 555 in FIG. 7G.

Dielectric 582 may be formed over active regions 410 and over dielectric plugs 630 in FIG. 6H. Dielectric 582 may be formed over conductor 550, and thus word lines 555, in FIG. 8 and over conductor 550, and thus drain select line 560, in FIG. 9C.

For some embodiments, the dielectric plugs 635 in FIG. 8 may be tapered as shown in FIG. 11 with a portion of isolation region 415 between a tapered dielectric plug 635 and active regions $410_1$ and $410_2$, dielectric 504, charge-storage structure 508, and at least a portion of dielectric 512. In addition, the stack in FIG. 11, including dielectrics 1110 and 1115 and conductor 1120, may be between the dielectric plugs 635, and thus dielectrics 512, and the conductor 550, and thus the word line 555, in FIG. 8. A portion of isolation region 415 may be between sides of a dielectric plug 630 and the active regions $410_1$ and $410_2$, e.g., a manner similar to that shown below the upper surfaces active regions $410_1$ and $410_2$ in FIG. 11.

Dielectric 582 is generally formed of one or more dielectric materials. For example, dielectric 582 may be formed from an oxide.

For some embodiments, dielectric 582 may have a low conformability, e.g., dielectric 582 may be a plasma enhanced TEOS (tetraethylorthosilicate) or silane oxide. Dielectric 582 may pinch off adjacent to a top of each of openings 581 before openings 581 can be completely filled with dielectric 582. Dielectric 582 may thus close openings 581 adjacent to the tops thereof. However, dielectric 582 may extend into openings 581, e.g., partially into openings 581, before pinching off. Openings 581 may have a relatively high aspect (height-to-width) ratio that acts to promote pinching off of dielectric 582.

The pinched-off openings 581 may form air-containing gaps, such as air gaps 583, between the memory cells 570 in string region 420, as shown in FIG. 5F. Note that the memory cells 570 in FIG. 12 may form a string (e.g., a NAND string) of series-coupled, memory cells between drain select gate 572 and source select gate 574.

It will be understood that the air gaps as defined herein may contain one or more gaseous components other than, or in addition to, ambient air. For example, an air gap as defined herein may contain oxygen, nitrogen, argon, neon or other gas compatible (e.g., inert) with the surrounding structures, or a gas containing a mixture of one or more such gaseous components. For one or more embodiments, the gas contained in an air gap of the present disclosure may further be below atmospheric pressure.

A dielectric 584 may be formed over dielectric 582 in FIGS. 5F, 6H, 7G, 8 and 9C. Dielectric 584 is generally formed of one or more dielectric materials. For example, dielectric 584 may be formed from a nitride.

A dielectric 586 may be formed over dielectric 584 in FIGS. 5F, 6H, 7G, 8, and 9C. Dielectric 586 is generally formed of one or more dielectric materials, and one example for dielectric 586 would be a doped silicate glass. Examples of doped silicate glasses include BSG (borosilicate glass), PSG (phosphosilicate glass), and BPSG (borophosphosilicate glass). Another example for dielectric 586 would be TEOS (tetraethylorthosilicate).

Openings 588 and 590 may be formed in dielectric 586 respectively in source/drain zone 460 and source/drain zone 445, passing through dielectrics 584 and 582 and stopping on or within active regions 410, as shown in FIGS. 5F and 6H. For some embodiments, a protective liner, such as a dielectric liner 592, may be formed over the sides of openings 588 and 590 and the bottom of openings 588 and 590. For example, dielectric liner 592 may be formed over dielectric 586 on the sides of openings 588 and 590 and over active region 410 at the bottom of openings 588 and 590. The portion of dielectric liner 592 at the bottom of openings 588 and 590 may be subsequently removed to re-expose active region 410.

Dielectric liner 592 is generally formed of one or more dielectric materials. For some embodiments, dielectric liner 592 may be formed from a material that etches about 10 times (e.g., at least 10 times) slower than isolation regions 415, such about 10 times (e.g., at least 10 times) slower than oxide. For example, dielectric liner 592 may be formed from a nitride.

An opening 788 may be formed in dielectric 586 in source/drain zone 460, passing through dielectrics 584 and 582 and stopping on or within dielectric plug 640, as shown in FIG. 7G. For some embodiments, a protective liner, such as a dielectric liner 792, may be formed over the sides of opening 788 and the bottom of opening 788. For example, dielectric liner 792 may be formed over dielectric 586 on the sides of opening 788 and over dielectric plug 640 at the bottom of opening 788. The portion of dielectric liner 792 at the bottom of opening 788 may be subsequently removed to re-expose dielectric plug 640.

Dielectric liner 792 is generally formed of one or more dielectric materials. For some embodiments, dielectric liner 792 may be formed from a material that etches about 10 times (e.g., at least 10 times) slower than isolation regions 415, such as about 10 times (e.g., at least 10 times) slower than oxide. For example, dielectric liner 792 may be formed from a nitride.

For some embodiments, openings 588 and 788 may be contiguous, e.g., contiguous portions of a single opening (e.g., trench) that may span the cross-sections viewed along lines A-A and E-E in FIG. 4. For example, the single opening may at least extend from the cross-section viewed along line E-E in FIG. 4 to the cross-section viewed along line A-A in FIG. 4 in a direction substantially perpendicular to lines A-A and E-E (e.g., to the column direction) and substantially parallel to lines B-B, C-C, and D-D (e.g., to the row direction). For some embodiments, each opening 590 may be a discrete opening, such as a discrete hole.

A conductor 594 may be formed, e.g., deposited, in openings 590, e.g., over dielectric liner 592 and over (e.g., in direct physical contact with) active regions $410_1$, to form contacts $440_1$ that electrically contact (e.g., by direct physical contact with) a respective active region $410_1$, as shown in FIGS. 5F and 6H. Conductor 594 may be also formed, e.g., deposited, in opening 588, e.g., over dielectric liner 592 and over (e.g., in direct physical contact with) active regions $410_1$, as shown in FIG. 5F, and active regions $410_2$ (not shown).

Conductor 594 may be also formed, e.g., deposited, in opening 788, e.g., over dielectric liner 792 and over (e.g., in direct physical contact with) dielectric plug 640, as shown in FIG. 7G. For example, the conductor 594 may be deposited within the trench formed by contiguous openings 588 and 788 to form source line 455 that electrically contacts (e.g., by direct physical contact with) active regions 410, as shown in FIG. 5F for a region $410_1$. Note that source line 455 may also contact dielectric plug 640, as shown in FIG. 7G.

For some embodiments, source line 455 may span the cross-sections viewed along lines A-A and E-E in FIG. 4. For example, source line 455 may at least extend from the cross-section viewed along line E-E in FIG. 4 to the cross-section viewed along line A-A in FIG. 4 in a direction substantially perpendicular to lines A-A and E-E (e.g., to the column direction) and substantially parallel to lines B-B, C-C, and D-D (e.g., to the row direction).

Conductor 594 may be blanket deposited to fill openings 588, 590, and 788 and may possibly extend over dielectric 586. Conductor 594 may then be removed from dielectric 586, e.g., by CMP, exposing an upper surface of dielectric 586 so that the upper surfaces of contacts $440_1$ and the upper surface of source line 455 may be substantially flush (e.g., flush) with the upper surface of dielectric 586, as shown in FIGS. 5F, 6H, and 7G. Note that contacts $440_2$ (FIG. 4) may be formed in electrical contact (e.g., by direct physical contact with) active regions 410₂ in a plane parallel to the face plane of FIG. 6H in a similar (e.g., the same) manner, e.g., from conductor 594.

Conductor 594 may be generally formed of one or more conductive materials. For example, conductor 594 may comprise, consist of, or consist essentially of a metal or metal-containing layer and may be aluminum, copper, a refractory metal, or a refractory metal silicide layer. In some embodiments, conductor 594 may contain multiple metal-containing layers, e.g., a titanium nitride (TiN) barrier layer formed over (e.g., in direct physical contact with) an active region 410 and dielectric plug 640 (FIG. 7G), a titanium (Ti) adhesion layer formed over the barrier layer, and a tungsten (W) layer formed over the adhesion layer.

For some embodiments a stack including dielectrics 1110 and 1115 and conductor 1120, as discussed in conjunction with FIG. 11, may be formed over dielectric 512 in FIG. 5D. Subsequently conductor 550 may be formed over conductor 1120.

FIG. 12 illustrates a cross-section taken along line A-A in FIG. 4, according to other embodiments, and corresponds to a stage of fabrication following the stage of fabrication depicted in FIG. 5D. For some embodiments, a protective material 1210, e.g., a dielectric, such as nitride, carbon, etc., may be formed over conductor 550, e.g., for protecting conductor 550, conductor 1120, dielectrics 1115, 1110, and 512, charge-storage structure 508, and dielectric 504 during the subsequent processing.

Portions of protective material 1210, conductor 550, conductor 1120, dielectrics 1115, 1110, and 512, charge-storage structure 508, and dielectric 504 are then removed, as shown in FIG. 12, stopping at a level (e.g., a vertical level), corresponding to above, below, or at the upper surface of an active region, such as an active region 410₁, to form openings 1215, 1217, and 1220 through protective material 1210, conductor 550, conductor 1120, dielectrics 1115, 1110, and 512, charge-storage structure 508, and dielectric 504, terminating at the level corresponding to above, below, or at the upper surface of active region 410₁.

A dielectric 1225, e.g., having a low conformability, such as plasma enhanced TEOS (tetraethylorthosilicate) or silane oxide, is then formed in openings 1215 and 1220. Dielectric 1225 may pinch off adjacent to a top of each of openings 1217 before openings 1217 can be completely filled with dielectric 1225. Dielectric 1225 may thus close openings 1217 adjacent to the tops thereof. However, dielectric 1225 may extend into openings 1217, e.g., partially into openings 1217, before pinching off. Openings 1217 may have a relatively high aspect (height-to-width) ratio that acts to promote pinching off of dielectric 1225.

The pinched-off openings 1217 may form air-containing gaps, such as air gaps 1230, that define memory cells 570 in string region 420, as shown in FIG. 12. Note that the memory cells 570 in FIG. 12 may form a string (e.g., a NAND string) of series-coupled, memory cells between drain select gate 572 and source select gate 574, where the air gaps 1230 are between the memory cells 570 in each string.

Openings 1215 and 1220 may have a lower aspect ratio than openings 1217 so that dielectric 1225 does not pinch off, but instead forms on the sides of openings 1215 and 1220, thus leaving openings 1215 and 1220 open at the top. Dielectric 1225 forms spacers 1227 on the sidewalls of drain select gate 576 and source select gate 578 and at least one of the sidewalls of drain select gate 572 and source select gate 574, as shown in FIG. 12. Note that drain select gates 572 and 576 and source select gates 574 and 578 may include dielectrics 1110 and 1115 and conductor 1120 between dielectric 512 and conductor 550 in the example of FIG. 12.

A dielectric 1230, such as nitride, (e.g., that may be referred to as a barrier) may then be formed over dielectric 1225. For example, dielectric 1230 may be formed over the spacers 1227 and over active region 410₁ at the bottom of openings 1215 and 1220 adjacent to spacers 1227. A dielectric 1250, such as a conformal oxide, may then be formed over dielectric 1230.

Openings 1255 and 1257 may then be formed through dielectric 1250, stopping at or within active region 410₁ and thus exposing active region 410₁. Source line 455 may then be formed in opening 1255, e.g., as described above in conjunction with FIG. 5F, and a contact 440₁ may be formed in opening 1257, e.g., as described above in conjunction with FIG. 5F.

Prior to forming contacts 440 and source line 455, a clean operation (e.g., a clean-up etch, such as an isotropic etch) may be performed, e.g., using a wet etch, to remove native oxide that may form on the exposed surfaces of active regions 410 for improving electrical contact between contacts 440 and active regions 410 and between source line 455 and active regions 410. For example, the wet etchant may be applied to the exposed surfaces of active regions 410 through openings 588, 590, and 788 of FIG. 5F or openings 1255 and 1257 of FIG. 12. The chemistry of the clean-up etchant may be the particular isotropic removal chemistry.

Source/drains, e.g., drains 598, may be formed in active regions 410 within source/drain zone 445, e.g., in portions of the active regions 410 shown in FIG. 6H, so that contacts 440 electrically contact the source/drains. These source/drains are coupled one-to-one to the drain select gates 572 that are shown in FIG. 9C and one-to-one to contacts 440.

Figure 10:
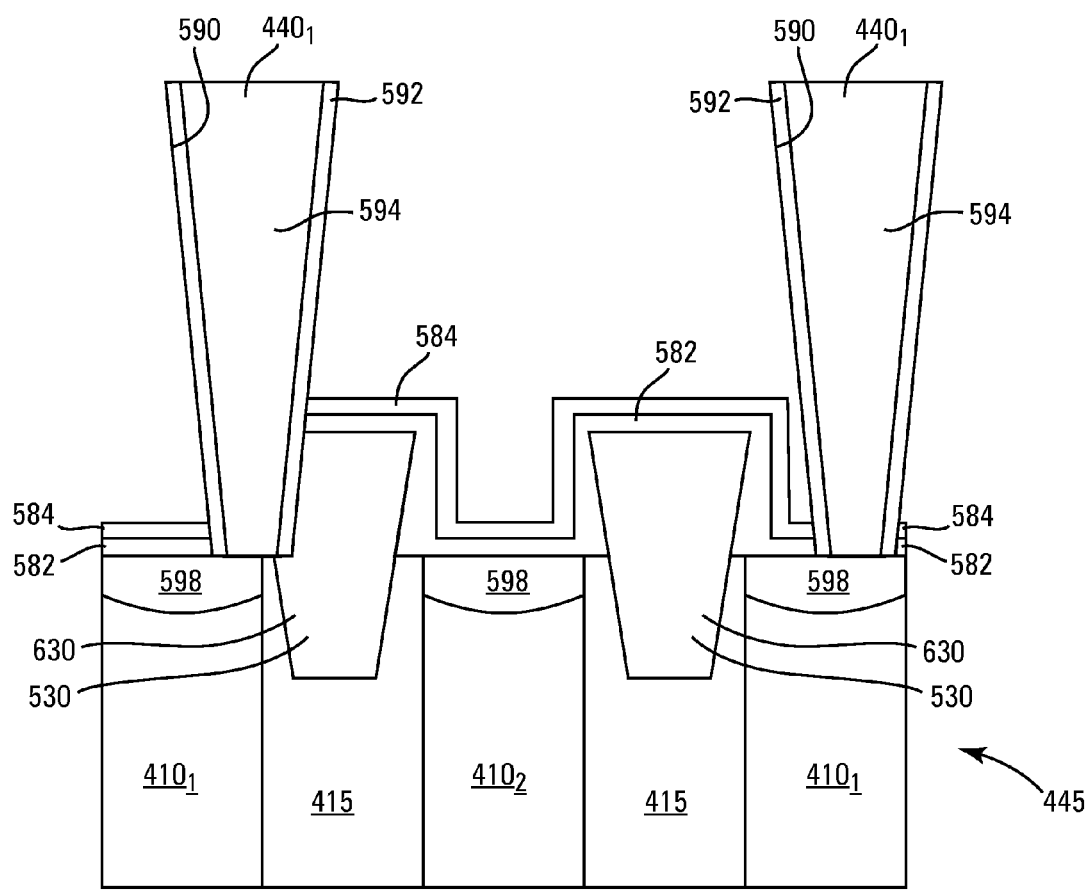
FIG. 10 is a cross-section illustrating a misaligned contact, according to another embodiment.

For some embodiments, in source/source/drain zone 445, dielectric plug 630 and an isolation region 415 may be between active regions 410₁ and 410₂, where the dielectric plug 630 extends below upper surfaces of active regions 410₁ and 410₂, as shown in FIGS. 6H and 10. For example, as shown FIG. 6H, isolation regions 415 are recessed below the upper surfaces of active regions 410 for some embodiments, so that their upper surfaces are below the upper surfaces of active regions 410. A dielectric plug 630 is over each isolation region 415 and may extend from the upper surface of a respective isolation region 415 to above the upper surfaces of active regions 410.

For some embodiments, each dielectric plug 630 may cover substantially an entire (e.g., the entire) upper surface of an underlying portion of a respective isolation region 415, as shown in FIGS. 6H and 7G. For example, each dielectric plug 630 may substantially fill (e.g., fill) an entire region over a respective isolation region 415, e.g., where the region over the respective isolation region 415 may extends from the upper surface of the respective isolation region 415 to a level above the upper surfaces of adjacent active regions 410₁ and 410₂. For other embodiments, each dielectric plug 630 may directly contact the upper surface of a respective underlying isolation region 415 and/or may directly contact a side of an adjacent active region 410₁ and a side of an adjacent active region 410₂. For still other embodiments, dielectric plugs 630 may be tapered and a portion of an isolation region 415 may be between a tapered dielectric plug and a side of an adjacent active region 410₁ and a side of an adjacent active region 410₂ (see FIG. 10, for example).

FIG. 10 shows a portion of source/source/drain zone 445, i.e., a portion of the cross-section of FIG. 6H, where a contact 440₁ is misaligned as a result of an opening 590 being misaligned. The misalignment causes the opening 590 and contact 440₁ to overlap an active region 410₁ and an adjacent isolation region 415. However, the portion of opening 590 that overlaps isolation region 415 extends into dielectric plug 630 so that opening 590 exposes a portion of that dielectric plug 630.

In contrast, in the prior art of FIG. 3, the misaligned opening 345₂ exposes isolation region 335₂, where isolation region 335₂ and isolation region 415 may have about the same etch rate as oxide, for example. Note that the dielectric plugs 630 in FIG. 10 replace the upper portion of isolation regions 335₁ and 335₂ in FIG. 3, so that a dielectric plug 630 is exposed instead of the upper portion of isolation region 335₂.

During the clean operation that removes the native oxide that may form on the active regions, the exposed isolation region 335₂ in the prior art can be etched by etchant (e.g., wet etchant) that is introduced through misaligned opening 345₂. That is, the isolation region 335₁ and dielectric 348 in FIG. 3 may etch at about the same rate as the native oxide when exposed to the etchant that removes the native oxide. This can cause an adjacent active region, e.g., active region 330₂ in FIG. 3, to be exposed by misaligned opening 345₂, as discussed above in conjunction with FIG. 3.

The region 360₂ may extend from misaligned opening 345₂ to active region 330₂ in FIG. 3. Region 360₂ may be filled with a conductor, e.g., conductor 365 in FIG. 3, during the formation of contact 328₂ in FIG. 3, causing an electrical short between contact 328₂ and active region active region 330₂. The portion 340 of contact 328₂ that forms in region 360₂ may be in contact with active region 330₂, causing the short.

However, the presence of the dielectric plugs 630 over the isolation regions 415 in the disclosed embodiments, as shown in FIG. 6H and in FIG. 10, so that a misaligned opening 590 exposes a dielectric plug 630 instead of an isolation region 415, may act to substantially eliminate (e.g., acts to eliminate) a short that may occur between a contact and an active region due to the misalignment of the opening and thus the contact. This is because the etch that removes the native oxide on the active region 410₁ that is exposed the misaligned opening 590 is substantially unselective to the dielectric 530, and thus dielectric plugs 630, that is also exposed by the misaligned opening 590. For example, dielectric plugs 630 have a lower etch rate, e.g., about 10 times less (e.g., at least 10 times less) than the etch rate of the oxide. For embodiments, where dielectric plugs 630 are nitride, the etch that removes the native oxide may be substantially selective to oxide and not to nitride.

When the clean operation is performed, e.g., by introducing an etchant, such as a wet etchant having the particular isotropic removal chemistry, through the misaligned opening 590, for removing native oxide from active region 410₁, the dielectric plug 630 overlapped by the misaligned opening 590 may remain substantially intact, e.g., the dielectric plug 630 remains substantially unetched, as shown in FIG. 10. This prevents the etchant from reaching active region 410₂ on the other side of the dielectric plug 630 overlapped by the misaligned opening 590. That is, the presence of the dielectric plug 630 acts to substantially prevent the formation of the region 340 in FIG. 3 that would otherwise form in the prior art.

Note that the source/drain zone 445 in FIGS. 6H and 10 may include active regions 410₁ and 410₂, each having a source/drain 598 formed therein. A contact 440₁ may be electrically coupled to the source/drain 598 in each active region 410₁, and a contact 440₂ may be electrically coupled to the source/drain 598 in each active region 410₂. An isolation region 415 may be formed between successively adjacent active regions 410₁ and 410₂, where an upper surface of each isolation region 415 may be below the upper surfaces of active regions 410₁ and 410₂. A dielectric plug 630 may be substantially vertically aligned (e.g., vertically aligned) with and over each active region 410₁ and 410₂, extending substantially vertically (e.g., vertically) from the upper surface of each isolation region 415 so that an upper surface of each dielectric plug 630 is above the upper surfaces of active regions 410₁ and 410₂.

FIG. 8 shows a row of memory cells 570 in string region 420, where each memory cell is over an active region 410 of semiconductor 500. A dielectric plug 635 is between adjacent memory cells 570. An isolation region 415 within semiconductor 500 is under each dielectric plug 635 so that the each isolation region 415 is substantially vertically aligned (vertically aligned) with a respective dielectric plug 635.

For some embodiments, a dielectric plug 635 may cover substantially an entire (e.g., the entire) upper surface of an underlying isolation region 415. For example, each dielectric plug 635 may substantially fill (e.g., fill) an entire region over a respective isolation region 415, e.g., where the region over the respective isolation region 415 extends from the upper surface of the respective isolation region 415 to a level of the upper surfaces of dielectric 512, e.g., to a bottom surface of conductor 550, and thus word line 555. For other embodiments, each dielectric plug 635 may directly contact the upper surface of a respective underlying isolation region 415, the bottom surface of word line 555, a side of an adjacent active region 410₁, and a side of an adjacent active region 410₂.

The upper surfaces of dielectric plugs 635 plugs may be substantially flush with (e.g., flush with) the upper surfaces of dielectric 512 of memory cells 570, as shown in FIG. 8. Isolation regions 415 may be recessed below the upper surfaces active regions 410 in string region 420.

For other embodiments, dielectric plugs 635 may be tapered and a portion of an isolation region 615 may be between a tapered dielectric plug 635 and a side of an adjacent active region 410₁ and a side of an adjacent active region 410₂, as shown in FIGS. 10 and 11. The isolation region 615 may also be between the tapered dielectric plug 635 and sides of dielectric 504, charge-storage structure 508, and at least a portion of a side of dielectric 512, as shown in FIG. 11.

FIGS. 5F, 7G, 9C, and 12 show that drain-select-gate region 425 is substantially devoid (e.g. devoid) of any underlying dielectric 530, meaning that there is substantially no (e.g., no) dielectric 530 under drain select gates 572. This is the result of the masking in FIG. 7B. FIG. 7G also shows that drain-select-gate region 450, and thus drain select gate 576 (FIG. 5F), and source-select-gate regions 430 and 470, and thus source select gates 574 and 578 (FIG. 5F) are substantially devoid (e.g. devoid) of any underlying dielectric 530. This is the result of the masking in FIG. 7B.

In the region between adjacent active regions 410₁ and 410₂, portions of an isolation region 415 underlie (e.g., are in direct contact with) drain select lines 560 in drain-select-gate regions 425 and 450 and source select lines 565 in source-select-gate regions 430 and 470, as shown in FIGS. 7G and 9C. This is the result of the masking in FIG. 7B. For example, an isolation region 415 between adjacent active regions 410₁ and 410₂, and thus between adjacent drain select gates 572, in drain-select-gate region 425 may extend to a level of the upper surfaces of dielectric 512 and thus to a bottom surface of a drain select line 560, as shown in FIGS. 7G and 9C.

An upper surface of an isolation region 415 in source/drain zone 445 may be recessed below upper surfaces of the active regions 410 in source/drain zone 445, as shown in FIG. 6H. However, for other embodiments, the upper surface of an isolation region 415 in source/drain zone 445 may be substantially flush (e.g., flush) with the upper surfaces of the active regions 410 in source/drain zone 445, as shown in FIG. 10.

For some embodiments, the upper surface of the dielectric plug 630 in source/drain zone 445 may be at substantially the same level (e.g., the same level) as the upper surfaces of the isolation region 415 respectively in drain-select-gate regions 425 and 450, e.g., the upper surface of the dielectric plug 630 may be substantially flush with (e.g., flush with) the upper surfaces of the isolation region 415 respectively in drain-select-gate regions 425 and 450, as shown in FIG. 7G.

The upper surface of an isolation region 415 in string region 420 may be recessed below the upper surfaces of that isolation region in drain-select-gate regions 425 and 450, as shown in FIG. 7G. The upper surface of a dielectric plug 635 formed over the recessed upper surface of the isolation region 415 in string region 420 may be at substantially the same level (e.g., the same level) as the upper surfaces of the isolation region 415 in drain-select-gate regions 425 and 450, as shown in FIG. 7G. For example, the upper surface of the dielectric plug 635 may be substantially flush with (e.g., flush with) the upper surfaces of region 415 in drain-select-gate regions 425 and 450.

In string region 420, dielectric 530, and thus dielectric plug 635, may be between isolation region 415 and word lines 555, e.g., dielectric plug 635 may be in direct contact with word lines 555, as shown in FIG. 7G. Dielectric plug 630 may be over isolation region 415 in source/drain zone 445 and dielectric plug 640 may be over isolation region 415 in source/drain zone 460, as shown in FIG. 7G. Note that the portion of the isolation region 415 in drain-select-gate region 425 that extends drain select line 560 is between dielectric plug 630 and dielectric plug 635.

The use of the term "substantially" herein accounts for routine process variations. For example, industrial processes, and thus structures produced thereby, are not exact, and minor variations may occur. For example the term "substantially fills" may account for a region not being exactly, e.g., completely filled, e.g., due to voids voids may be present in a material disposed in a trench so that the trench is not exactly full. For example, the term "substantially flush" may refer to surfaces that are flush to within routine variations of the processes that create the surfaces. For example, when elements are at substantially the same level they are at the same level to within routine variations of the processes that create the elements.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of forming a source/drain zone, comprising:
   forming an isolation region between first and second active regions in a semiconductor, wherein the isolation region is formed from a first dielectric material;
   forming an opening between the first and second active regions by removing a portion of the first dielectric material; and
   forming a dielectric plug within the opening on a remaining portion of the first dielectric material so that the dielectric plug is between the first and second active regions and so that a portion of the dielectric plug extends below upper surfaces of the first and second active regions;
   wherein the dielectric plug is formed from a second dielectric material having a lower removal rate than the first dielectric material for a particular isotropic removal chemistry.

2. The method of claim 1, wherein forming the dielectric plug within the opening comprises forming the dielectric plug so that another portion of the dielectric plug extends above the upper surfaces of the first and second active regions.

3. The method of claim 1, further comprising forming first and second contacts respectively over the first and second active regions.

4. The method of claim 1, wherein the second dielectric material is nitride and the first dielectric material is oxide.

5. The method of claim 1, wherein portions of the remaining portion of the first dielectric material are between the dielectric plug and the first and second active regions.

6. The method of claim 5, wherein the opening between the first and second active regions is tapered so that so that the portions of the remaining portion of the first dielectric material that are between the dielectric plug and the first and second active regions are tapered.

7. A method of forming a memory array, comprising:
   forming an isolation region between first and second active regions in a semiconductor, wherein the isolation region is formed from a dielectric;
   forming an opening in a portion of the dielectric in a source/drain zone so that the opening extends below upper surfaces of the first and second active regions and below an upper surface of a portion of the dielectric in a select-gate region;
   forming a dielectric plug in the opening in the portion of the dielectric in the source/drain zone so that the dielectric plug extends above the upper surfaces of the first and second active regions; and
   recessing the portion of the dielectric in the select-gate region to substantially a level of an upper surface of the dielectric plug.

8. The method of claim 7, wherein a portion of the portion of the dielectric in the source/drain zone is between the dielectric plug and the first and second active regions.

9. The method of claim 7, wherein the dielectric is a first dielectric, and further comprising:
   forming a second dielectric over the recessed portion of the first dielectric in the select-gate region;
   forming a third dielectric over the second dielectric in the select-gate region;
   forming a control gate electrode over the third dielectric in the select-gate region; and
   forming an select line over the control gate electrode in the select-gate region.

10. The method of claim 7, further comprising forming first and second contacts respectively over the first and second active regions in the source/drain zone.

11. The method of claim 7, further comprising protecting the portion of the first dielectric in the select-gate region while forming the opening in the portion of the first dielectric in the source/drain zone.

12. A method of forming a memory array, comprising:
forming an isolation region between first and second active regions in a semiconductor;
forming an opening in a portion of the isolation region in a source/drain zone so that the opening extends below upper surfaces of the first and second active regions and below an upper surface of a portion of the isolation region in a select-gate region;
protecting the portion of the isolation region in the select-gate region while forming the opening in the portion of the isolation region in the source/drain zone;
forming a first dielectric plug in the opening in the portion of the isolation region in the source/drain zone so that the dielectric plug extends above the upper surfaces of the first and second active regions;
recessing the portion of the isolation region in the select-gate region to substantially a level of an upper surface of the dielectric plug;
forming an opening in a portion of the isolation region in a memory-cell region so that the opening in the portion of the isolation region in the memory-cell region extends below the upper surfaces of the first and second active regions and below the upper surface of the portion of the isolation region in a select-gate region; and
forming a second dielectric plug in the opening in the portion of the isolation region in the memory-cell region so that the second dielectric plug extends above the upper surfaces of the first and second active regions and so that the portion of the isolation region in the select-gate region is between the first and second dielectric plugs.

13. The method of claim 12, wherein a portion of the portion of the isolation region in the memory-cell region is between the second dielectric plug and the first and second active regions.

14. The method of claim 12, further comprising:
forming a conductor over the recessed portion of the isolation region in the select-gate region of the memory array and over the first and second dielectric plugs; and
removing the conductor from the first dielectric plug and removing portions of the conductor over the second dielectric plug while leaving the conductor over the recessed portion of the isolation region in the select-gate region;
wherein remaining portions of the conductor over the second dielectric plug form portions of access lines and the conductor over the recessed portion of the isolation region in the select-gate region forms a select line.

15. The method of claim 14, wherein the conductor is a first conductor, and further comprising, before forming the first conductor over the recessed portion of the isolation region in the select-gate region of the memory array and over the first and second dielectric plugs:
forming a first dielectric over the recessed portion of the isolation region in the select-gate region of the memory array and over the first and second dielectric plugs;
forming a second dielectric over the first dielectric; and
forming a second conductor over the second dielectric;
wherein forming the first conductor over the recessed portion of the isolation region in the select-gate region of the memory array and over the first and second dielectric plugs, comprises forming the first conductor over the second conductor; and
wherein removing the first conductor from the first dielectric plug and removing portions of the first conductor over the second dielectric plug while leaving the first conductor over the recessed portion of the isolation region in the select-gate region comprises removing first conductor, the second conductor, the second dielectric, and the first dielectric from the first dielectric plug and removing portions of the first conductor, the second conductor, the second dielectric, and the first dielectric over the second dielectric plug while leaving the first conductor, the second conductor, the second dielectric, and the first dielectric over the recessed portion of the isolation region in the select-gate region.

16. The method of claim 7, wherein forming the dielectric plug comprises forming the dielectric plug from nitride.

17. A method of forming a memory array, comprising:
forming an isolation region between first and second active regions in a semiconductor;
forming an opening in a portion of the isolation region in a source/drain zone so that the opening extends below upper surfaces of the first and second active regions and below an upper surface of a portion of the isolation region in a select-gate region;
forming a dielectric plug in the opening in the portion of the isolation region in the source/drain zone so that the dielectric plug extends above the upper surfaces of the first and second active regions; and
recessing the portion of the isolation region in the select-gate region to substantially a level of an upper surface of the dielectric plug,
wherein forming the isolation region between first and second active regions in the semiconductor further comprises forming the isolation region through a first dielectric over the upper surfaces of the first and second active regions, a charge-storage structure over the first dielectric, a second dielectric over the charge-storage structure, and a sacrificial material over the second dielectric;
wherein forming the dielectric plug in the opening in the portion of the isolation region in the source/drain zone so that the dielectric plug extends above the upper surfaces of the first and second active regions comprises:
forming a dielectric of the dielectric plug to extend through the first dielectric, the charge-storage structure, the second dielectric, and the sacrificial material;
removing the dielectric of the dielectric plug and the sacrificial material to about a level of an upper surface of the second dielectric;
forming a conductor over the dielectric of the dielectric plug and the upper surface of the second dielectric;
removing the conductor; and
removing the second dielectric, the charge-storage structure; and the first dielectric to expose the upper surfaces of the first and second active regions.

18. A method of forming a memory array, comprising:
forming an isolation region between first and second active regions in a semiconductor, wherein the isolation region is formed from a dielectric material;
forming an opening in a portion of the dielectric material in a source/drain zone so that the opening extends below upper surfaces of the first and second active regions and below an upper surface of a portion of the dielectric material in a select-gate region;

forming a dielectric plug in the opening in the portion of the dielectric material in the source/drain zone so that the dielectric plug extends above the upper surfaces of the first and second active regions;

recessing the portion of the dielectric material in the select-gate region to substantially a level of an upper surface of the dielectric plug; and forming a select line in contact with the recessed portion of the dielectric material in the select-gate region.

19. The method of claim 18, wherein the dielectric material is a first dielectric material, wherein the dielectric plug is formed of a second dielectric material having a lower removal rate than the first dielectric material for a particular isotropic removal chemistry.

20. The method of claim 18, further comprising forming source/drains in the first and second active regions in the source/drain zone.

21. The method of claim 20, further comprising forming contacts in contact with the source/drains in the first and second active regions in the source/drain zone.

* * * * *